United States Patent
Endres et al.

(10) Patent No.: US 9,983,484 B2
(45) Date of Patent: May 29, 2018

(54) ILLUMINATION OPTICAL UNIT FOR EUV PROJECTION LITHOGRAPHY

(71) Applicant: Carl Zeiss SMT GmbH, Oberkochen (DE)

(72) Inventors: Martin Endres, Koenigsbronn (DE); Ralf Mueller, Aalen (DE); Stig Bieling, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 15/596,628

(22) Filed: May 16, 2017

(65) Prior Publication Data

US 2017/0248851 A1 Aug. 31, 2017

Related U.S. Application Data

(63) Continuation of application No. PCT/EP2015/072985, filed on Oct. 6, 2015.

(30) Foreign Application Priority Data

Nov. 18, 2014 (DE) .................. 10 2014 223 452
Nov. 18, 2014 (DE) .................. 10 2014 223 453

(51) Int. Cl.
G03F 7/20 (2006.01)

(52) U.S. Cl.
CPC .......... *G03F 7/702* (2013.01); *G03F 7/70716* (2013.01)

(58) Field of Classification Search
CPC ..... G03F 7/702; G03F 7/7075; G03F 7/70716
(Continued)

(56) References Cited

U.S. PATENT DOCUMENTS

| 6,438,199 B1 | 8/2002 | Schultz et al. |
| 6,507,440 B1 | 1/2003 | Schultz |

(Continued)

FOREIGN PATENT DOCUMENTS

| DE | 10 2009 011 328 A1 | 8/2010 |
| DE | 10 2009 045 096 A1 | 10/2010 |

(Continued)

OTHER PUBLICATIONS

German Office Action, with translation thereof, for corresponding DE Appl No. 10 2014 223 453.0, dated Jul. 8, 2015.

(Continued)

*Primary Examiner* — Hung Henry Nguyen
(74) *Attorney, Agent, or Firm* — Fish & Richardson P.C.

(57) ABSTRACT

An illumination optical unit for EUV projection lithography serves to illuminate an object field with illumination light. A transmission optical unit images field facets in a manner superposed on one another into the object field via illumination channels, which each have assigned to them one of the field facets and one pupil facet of a pupil facet mirror. The superposition optical unit has at least two mirrors for grazing incidence, downstream of the pupil facet mirror. The mirrors for grazing incidence produce an illumination angle bandwidth of an illumination light overall beam, composed of the illumination channels, in the object field. The bandwith is smaller for a plane of incidence parallel to the object displacement direction than for a plane perpendicular thereto. The result can be an illumination optical unit, by which a projection optical unit can be adapted to a configuration of an EUV light source for the illumination light.

20 Claims, 17 Drawing Sheets

(58) Field of Classification Search
USPC .................................... 355/53, 55, 67–71
See application file for complete search history.

(56) References Cited

U.S. PATENT DOCUMENTS

| | | |
|---|---|---|
| 2003/0002022 A1 | 1/2003 | Schultz |
| 2007/0058269 A1 | 3/2007 | Mann et al. |
| 2011/0001947 A1 | 1/2011 | Dinger et al. |
| 2011/0318696 A1 | 12/2011 | Endres |
| 2012/0242968 A1* | 9/2012 | Layh .................. G03F 7/70075 355/67 |
| 2014/0368803 A1* | 12/2014 | Patra .................. G02B 27/0927 355/67 |
| 2015/0036115 A1* | 2/2015 | Patra .................. G02B 26/0833 355/67 |

FOREIGN PATENT DOCUMENTS

| | | |
|---|---|---|
| DE | 10 2012 202 675 A1 | 1/2013 |
| DE | 10 2013 202 278 A1 | 2/2014 |
| WO | WO 2012/034995 A2 | 3/2012 |

OTHER PUBLICATIONS

International Search Report and Written Opinion for corresponding PCT Appl No. PCT/EP2015/072985, dated Jan. 28, 2106.

\* cited by examiner

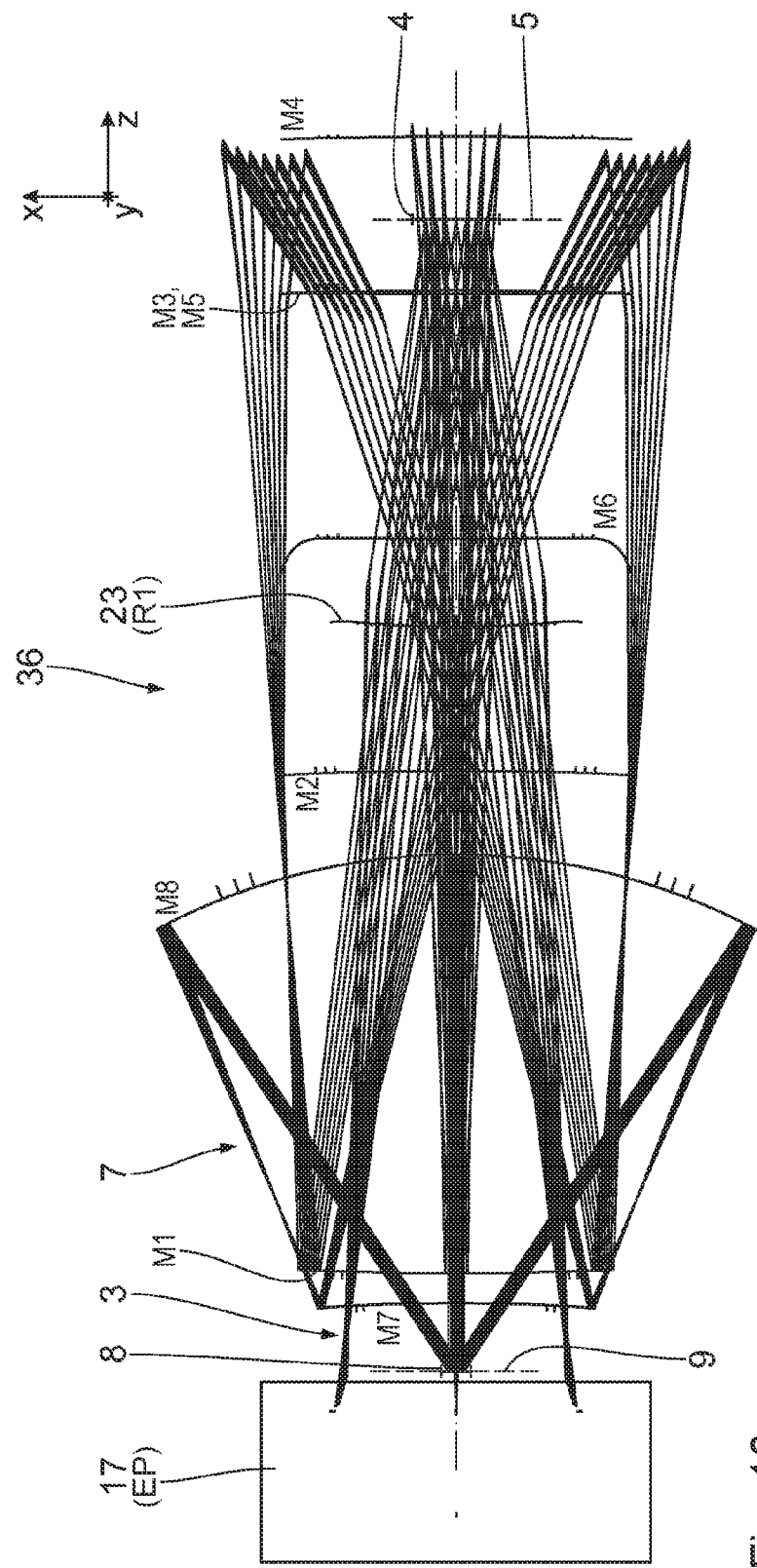

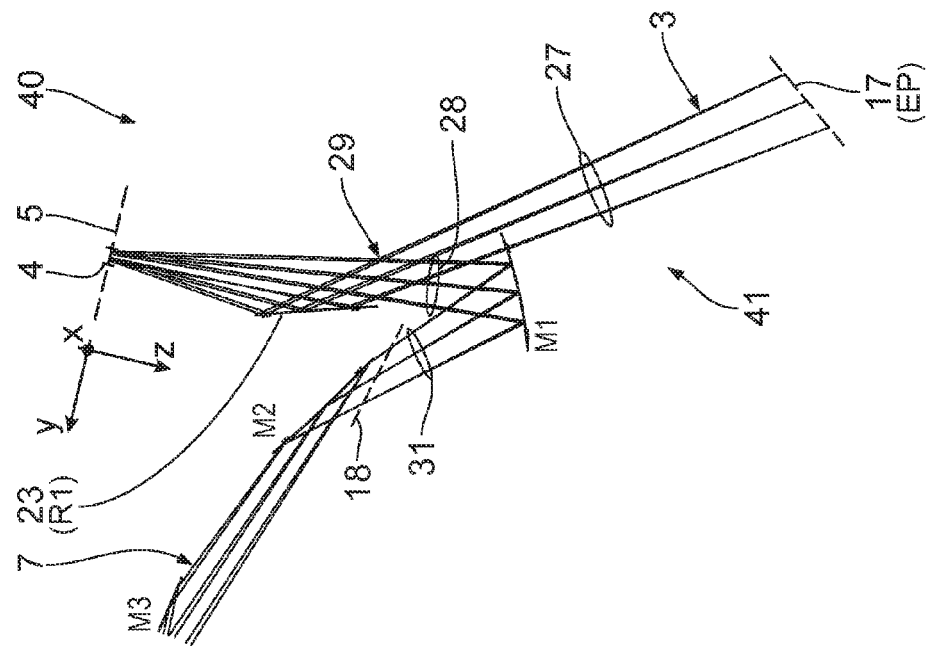
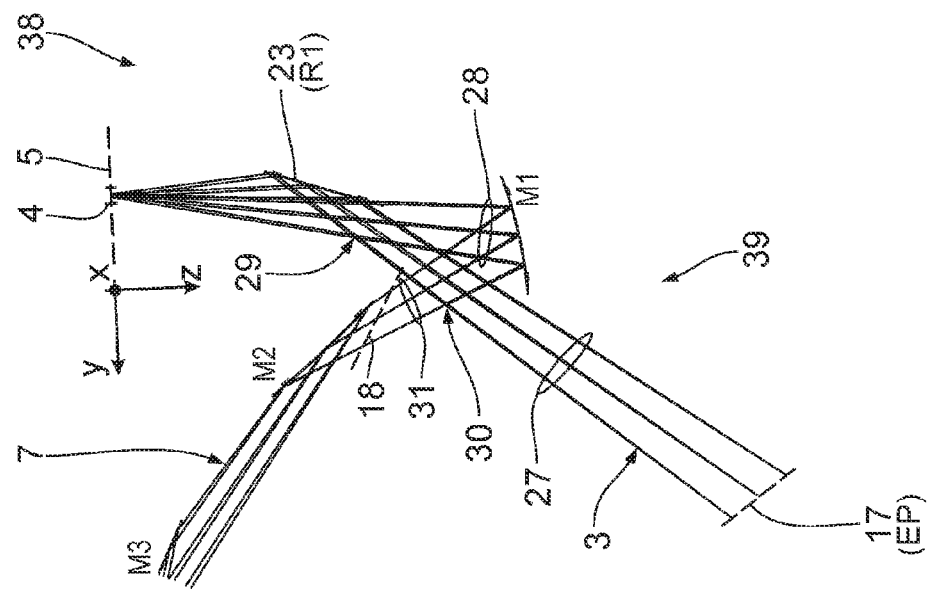

ILLUMINATION OPTICAL UNIT FOR EUV PROJECTION LITHOGRAPHY

CROSS-REFERENCE TO RELATED APPLICATIONS

The present application is a continuation of, and claims benefit under 35 USC 120 to, international application PCT/EP2015/075985, filed Oct. 16, 2015, which claims benefit under 35 USC 119 of German Application No. 10 2014 223 453.0 and German Application No. 10 2014 223 452.2, both filed Nov. 18, 2014. The entire disclosure of international application PCT/EP2012/054664 and German Application Nos. 10 2014 223 453.0 and 10 2014 223 452.2 are incorporated by reference herein.

FIELD

The disclosure relates to an illumination optical unit for EUV projection lithography. Furthermore, the disclosure relates to an illumination system including such an illumination optical unit and a projection optical unit, a projection exposure apparatus including such an illumination system, a method for producing a microstructured or nanostructured component using such a projection exposure apparatus and a microstructured or nanostructured component produced by the method.

BACKGROUND

Illumination optical units for EUV projection lithography for illuminating an object field with illumination light, wherein an object to be imaged is arrangeable in the object field, are known from U.S. Pat. No. 6,507,440 B1, U.S. Pat. No. 6,438,199 B1, US 2011/0318696 A1, US 2011/0001947 A1 and WO 2012/034995 A2.

SUMMARY

The disclosure seeks to develop an illumination optical unit of the type set forth at the outset in such a way that, by way thereof, a projection optical unit can be adapted to a configuration of an EUV light source for the illumination light.

In an aspect, the disclosure provides an illumination optical unit for EUV projection lithography for illuminating an object field with illumination light. An object to be imaged is arrangeable in the object field. The object is displaceable in an object displacement direction via an object holder during a projection exposure. The illumination optical unit includes a field facet mirror including a plurality of field facets, which are respectively constructed from at least one individual mirror. The illumination optical unit also includes a pupil facet mirror including a plurality of pupil facets, which is part of a transmission optical unit, which images the field facets in a manner superposed on one another into the object field by way of illumination channels, which each have assigned to them one of the field facets and one of the pupil facets. The transmission optical unit has at least two mirrors for grazing incidence, which are arranged downstream of the pupil facet mirror in the beam path of the illumination light, and generate an illumination angle bandwidth of an illumination light overall beam, composed of the illumination channels, in the object field. The bandwidth is smaller for a plane of incidence of the illumination light on the object field parallel to the object displacement direction than for a plane perpendicular there-to.

A feature that was identified according to the disclosure was that an arrangement of at least two mirrors for grazing incidence between a pupil facet mirror and an object field to be illuminated leads to the possibility of influencing a ratio of an illumination angle bandwidth of an illumination light overall beam at the object field, firstly in a plane of incidence parallel to the object displacement direction and secondly perpendicular thereto, and hence of influencing a dimension ratio of assigned pupil dimensions (sigmax, sigmay) of an illumination pupil of the illumination optical unit. This renders it possible to satisfy desired features of such an illumination angle bandwidth ratio, which arise from the design of a subsequent projection optical unit, with the aid of the at least two mirrors for grazing incidence. An x/y-aspect ratio of the angle bandwidth of the illumination light overall beam is a measure for the numerical apertures thereof, firstly in the plane of incidence parallel to the object displacement direction and secondly perpendicular thereto. This x/y-aspect ratio of the angle bandwidth is greater than 1 and, in particular, lies in the range between 1.1 and 4, for example in the range between 1.5 and 3 or in the range between 1.8 and 2.5. In particular, the x/y-aspect ratio of the angle bandwidth can lie at 2. In particular, the illumination optical unit can be adapted to an anamorphic projection optical unit which images the object field, without major changes in a configuration of the field facet mirror and of the pupil facet mirror being necessary. The different illumination angle bandwidths in the planes of incidence parallel and perpendicular to the object displacement direction, which are caused by the at least two mirrors for grazing incidence, can then be adapted to different object-side numerical apertures of the anamorphic projection optical unit. The field facets of the field facet mirror can be constructed monolithically. Alternatively, the field facets of the field facet mirror can also be constructed from a plurality and from a multiplicity of micro-mirrors. Field facets of the field facet mirror can be configured to be switchable between at least two angle positions. Pupil facets of the pupil facet mirror can be configured to be fixed, i.e. not switchable, but, alternatively, also to be switchable between at least two angle positions. The illumination optical unit can have exactly two mirrors for grazing incidence. Alternatively, the illumination optical unit can also have a larger number of mirrors, e.g. three, four or five, for grazing incidence, with it then being possible to distribute an effect of these mirrors for grazing incidence on the aspect ratio of the illumination angle bandwidth of the illumination light overall angle at the object field among the individual mirrors.

The at least two mirrors for grazing incidence can moreover have such an imaging effect that a pupil plane of a projection optical unit, disposed downstream of the object field, for the pupil facet mirror is made accessible. To this end, the at least two mirrors for grazing incidence can image an arrangement plane of the pupil facet mirror and, in particular, the illumination pupil into an entry pupil plane of the projection optical unit disposed downstream.

The two mirrors for grazing incidence can be arranged in such a way that the deflection effect thereof on the illumination light adds up. Such an arrangement of the mirrors for grazing incidence was found to be advantageous in relation to the effect of these mirrors on an intensity distribution over the cross section of the illumination light overall beam. Then, an intensity attenuation caused by reflection losses at the respective mirrors for grazing incidence, which intensity attenuation is generally dependent on the angle of incidence, is compensated in the case of the reflection at the various mirrors for grazing incidence which add up in terms of their deflective effect.

A totality of the pupil facets on the pupil facet mirror can have an edge contour, having an aspect ratio (x/y) between an extent (x) of the edge contour perpendicular to the object displacement direction and an extent (y) of the edge contour parallel to the object displacement direction, which is less than an aspect ratio (sigmax/sigmay) between dimensions of an illumination pupil of the illumination optical unit, which are assigned to these extents of the edge contour perpendicular (x) and parallel (y) to the object displacement direction. Such an edge contour of the pupil facet mirror can be adapted to a desired illumination angle bandwidth ratio, which is intended to be caused by the at least two mirrors for grazing incidence. This x/y-aspect ratio of the edge contour of the pupil facet mirror is less than an x/y illumination angle bandwidth ratio of the illumination light overall beam caused by the at least two mirrors for grazing incidence. This x/y illumination angle bandwidth ratio equals the aspect ratio sigmax/sigmay of the illumination pupil dimensions. By way of example, the x/y-aspect ratio of the edge contour of the pupil facet mirror can be 4/3. Alternatively, the x/y-aspect ratio of the edge contour of the pupil facet mirror can also be smaller and, in particular, equal 1. By reducing the x/y-aspect ratio of the pupil facet mirror edge contour, a design of the pupil facet mirror is achieved, in which a minimization of involved switching angles of field facets of the field facet mirror, which are for changing illumination angle distribution, can be brought about.

The field facets can be constructed from a plurality of micro-mirrors. Such a design of the field facets enables a flexible grouping of the micro-mirrors into field facets, which are respectively imaged into the object field by way of an associated pupil facet. In principle, such a design of the field facets made of micro-mirrors is known from US 2011/0001947 A1 and US 2011/0318696 A1.

The field facets can have an x/y-aspect ratio, which is greater than the x/y-aspect ratio of the object field. Such an x/y-aspect ratio of field facets enables an adaptation to imaging variations, which can be caused by way of the at least two mirrors for grazing incidence. Unwanted overexposure of the object field along the object displacement direction can be avoided.

The illumination optical unit can include an imaging optical subunit, which images an arrangement plane lying upstream of the object field in the beam path of the imaging light into a pupil plane of a projection optical unit arrangeable down-stream thereof. The imaging optical subunit is configured in such a way that it only causes grazing deflection of the imaging light in the beam path upstream of the object field and it has a GI mirror as last mirror in the beam path upstream of the object field. In the case of such an illumination optical unit, a pupil of a projection optical unit lying in the beam path downstream of the object field can be imaged by illumination-optical components into an accessible installation space in the beam path upstream of the object field. Projection optical units with a pupil lying downstream of the object field in the beam path of the imaging light, in particular with an entry pupil lying downstream of the object field in the beam path of the imaging light, can be used with small transmission loss of the illumination light or imaging light. The illumination-optical components, which image an arrangement plane in an accessible installation space in the beam path upstream of the object field into a pupil of a projection optical unit lying downstream of the object field in the beam path, can deflect the illumination light only in a grazing manner, i.e. only with mirrors for grazing incidence (grazing incidence, GI mirrors), wherein, in the case of grazing deflection, the illumination light with angles of incidence of greater than 60° is reflected. This leads to a corresponding improvement in the reflectivity and an increase in the throughput, resulting therefrom, compared to previously used imaging optical subunits for imaging an arrangement plane in the beam path upstream of the object field into the pupil plane in the beam path downstream of the object field. Imaging optical subunits previously used to this end have, from an illumination-optical point of view, at least one mirror which reflects the illumination light near perpendicular incidence, i.e. with angles of incidence less than 45° (NI mirror). The optical subsystem can have a catoptric embodiment. The imaging optical subunit can fold the imaging light in a plane, which contains an object displacement direction of the object to be imaged. Alternatively or additionally, the imaging optical subunit can fold the illumination light in a plane perpendicular to the object displacement direction. In order to image the arrangement plane lying upstream of the object field in the beam path into the pupil of the projection optical unit lying downstream of the object field in the beam path, the imaging optical subunit can also have a mirror arranged downstream of the object field in the beam path, i.e. a mirror of the projection optical unit, in addition to the at least one mirror arranged upstream of the object field in the beam path and only deflecting the imaging light in a grazing fashion. This mirror of the projection optical unit, which is part of the imaging optical subunit, can be an NI mirror or a GI mirror. It is also possible for a plurality of mirrors of the projection optical unit to belong to the imaging optical subunit.

The pupil of the projection optical unit arranged downstream of the object field in the beam path of the imaging light generally constitutes an entry pupil of the projection optical unit. This pupil may be arranged in a pupil plane. However, this is not mandatory. The pupil may also be arranged on a three-dimensional, e.g. curved, surface. It is also possible for the pupil for individual rays of the imaging light, which extend through the projection optical unit in a first plane of extent, e.g. in a common folding or meridional plane, to lie at a different point in the projection optical unit than in a second plane of extent perpendicular thereto.

The imaging optical subunit of the illumination optical unit can be part of an optical subsystem for projection lithography. This optical subsystem can include the projection optical unit for imaging the object field, in which the object to be imaged is arrangeable, into the image field. The projection optical unit can include a plurality of mirrors for guiding the imaging light from the object field to the image field and a pupil which is arranged downstream of the object field in the beam path of the imaging light.

The imaging optical subunit can have exactly one GI mirror. Exactly one such GI mirror of the imaging optical subunit enables an embodiment of the imaging optical subunit with a particularly high reflection for the illumination or imaging light.

The imaging optical subunit can have at least two GI mirrors. Such an imaging optical subunit improves an imaging effect when imaging the arrangement plane into the pupil plane of the projection optical unit. The imaging optical subunit can have exactly two GI mirrors, exactly three, exactly four, exactly five GI mirrors or it can have an even greater number of GI mirrors.

Two GI mirrors of the imaging optical subunit can be arranged directly in succession in the beam path of the imaging light. Such a GI mirror pair can be arranged in such a way that a deflecting effect of the GI mirrors for the illumination light adds up. Alternatively, an opposite or subtractive deflecting effect of the GI mirrors is also possible. By way of such deflecting overall effects, it is possible to predetermine a position of the arrangement plane and/or an angle between the arrangement plane and the object plane, which can be used to satisfy specific desired installation space properties for illumination-optical components of a projection exposure apparatus.

The imaging optical subunit can include at least one mirror of the projection optical unit. Such a design of the imaging optical subunit elegantly uses the imaging effect of at least one mirror of the projection optical unit. The imaging optical subunit can contain exactly one mirror of the projection optical unit. Alternatively, the imaging optical subunit can also contain a plurality of mirrors of the projection optical unit.

The imaging optical subunit can have at least one reflecting free-form surface. By way of such a free-form surface design of at least one mirror of the imaging optical subunit, it is possible to precisely predetermine an imaging effect of the imaging optical subunit. A sufficiently aberration-free imaging effect when imaging the arrangement plane into the pupil plane of the projection optical unit can also be ensured when using exactly one mirror for grazing incidence, i.e. exactly one GI mirror.

Firstly, a first illumination-side imaging light partial beam upstream of the last GI mirror in the beam path upstream of the object field can cross with, secondly, a second, imaging-side imaging light partial beam between the object field and the first mirror of the projection optical unit in the beam path downstream of the object field. The imaging-side imaging light partial beam can be arranged spatially between the last GI mirror in the beam path upstream of the object field and a second mirror of the projection optical unit in the beam path downstream of the object field. Alternatively, the last GI mirror in the beam path upstream of the object field can be arranged spatially between the imaging-side imaging light partial beam and a second mirror of the projection optical unit in the beam path downstream of the object field. Such crossing imaging light partial beams take account of corresponding installation space conditions, firstly for the illumination-optical components and secondly for the components of the projection optical unit. In particular, a distance between, firstly, the last GI mirror of the imaging optical subunit and, secondly, the imaging-side imaging light partial beam can have an advantageously large embodiment in the case of such crossing arrangements.

An optical system including an illumination optical unit for projection lithography for illuminating an object field, in which an object to be imaged is arrangeable, can have an optical subsystem or an imaging optical subunit with the features explained above.

The imaging optical subunit explained above, as a component of the illumination optical unit, can have all features which were already explained above in conjunction with the optical subsystem containing the projection optical unit. Conversely, the optical subsystem can have all features which were explained above in conjunction with the imaging optical subunit.

In an aspect, the disclosure provides an illumination system including an illumination optical unit according to the disclosure and a projection optical unit for imaging the object field into an image field. The advantages of such an illumination system correspond to those which explained above with reference to the illumination optical unit according to the disclosure or the optical subsystem.

The projection optical unit can be anamorphic. Such an illumination system can be configured in such a way that the object-side numerical aperture thereof in a plane of incidence parallel to the object displacement direction is half the size compared to in a plane perpendicular thereto. By way of example, such a projection optical unit is known from WO 2012/034995 A2. The projection optical unit can have a plurality of mirrors for guiding illumination light or imaging light from the object field to the image field. A pupil of the projection optical unit can be arranged in the beam path of the imaging light downstream of the object field.

In an aspect, the disclosure provides a projection exposure apparatus that includes an illumination system described herein, an object holder for holding the object, and a wafer holder for holding the wafer. The object holder is connected to an object displacement drive for displacing the object in the object displacement direction. The wafer holder is connected to a wafer displacement drive for displacing the wafer in a manner synchronized with the object displacement drive. The advantages of such a projection exposure apparatus correspond to those which explained above with reference to the illumination optical unit according to the disclosure or the optical subsystem.

In an aspect, the disclosure provides a method for producing a microstructured component. The method includes the following method steps: providing a reticle; providing a wafer with a coating sensitive to the illumination light; projecting at least a portion of the reticle onto the wafe with the aid of a projection exposure apparatus according to the disclosure; and developing the light-sensitive layer on the wafer exposed by the illumination light. The advantages of such a method correspond to those which explained above with reference to the illumination optical unit according to the disclosure or the optical subsystem.

In an aspect, the disclosure provides a component produced by a method according to the disclosure. The advantages of such a component correspond to those which explained above with reference to the illumination optical unit according to the disclosure or the optical subsystem.

The EUV light source can have an illumination light wavelength in the range between 5 nm and 30 nm.

The produced microstructured or nanostructured component can be a semiconductor chip, for example a memory chip.

BRIEF DESCRIPTION OF THE DRAWINGS

Exemplary embodiments of the disclosure are explained in more detail below on the basis of the drawings, in which:

FIGS. 5 to 10 show, in illustrations similar to FIGS. 3 and 4 in each case, further embodiments of an optical subsystem;

FIGS. 11 and 12 show variants of a folding effect of a mirror for grazing incidence, which, as part of an imaging optical subunit of the optical subsystem, has the last mirror in the beam path upstream of the object field, wherein the folding plane thereof contains an object displacement direction of an object to be imaged with the imaging optical unit;

DESCRIPTION OF EXEMPLARY EMBODIMENTS

Figure 1:
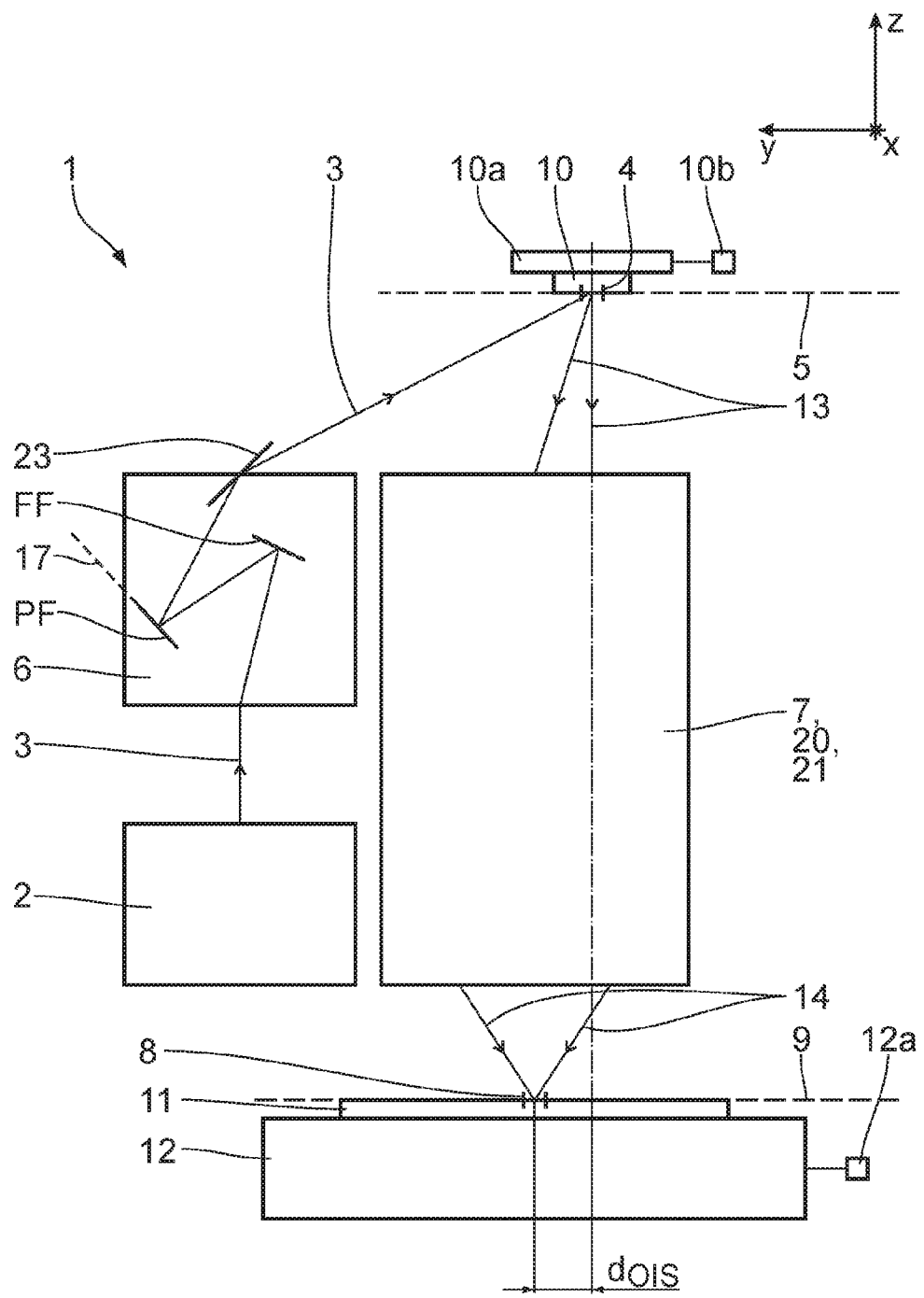
FIG. 1 schematically shows a projection exposure apparatus for EUV microlithography.

A microlithographic projection exposure apparatus 1 has a light source 2 for illumination light or imaging light 3. The light source 2 is an EUV light source, which produces light in a wavelength range of e.g. between 5 nm and 30 nm, in particular between 5 nm and 15 nm. In particular, the light source 2 can be a light source with a wavelength of 13.5 nm or a light source with a wavelength of 6.9 nm. Other EUV wavelengths are also possible. Use can be made of a light source as described below in conjunction with FIG. 17 et seq. In general, even arbitrary wavelengths are possible for the illumination light 3 guided in the projection exposure apparatus 1, for example visible wavelengths or else other wavelengths which may find use in microlithography (e.g. DUV, deep ultraviolet) and for which suitable laser light sources and/or LED light sources are available (e.g. 365 nm, 248 nm, 193 nm, 157 nm, 129 nm, 109 nm). A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs toward the left, and the z-direction runs upward. The object plane 5 extends parallel to the xy-plane.

The object field 4 and the image field 8 are rectangular. Alternatively, it is also possible for the object field 4 and the image field 8 to have a bent or curved embodiment, that is to say, in particular, a partial ring shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

Figure 2:
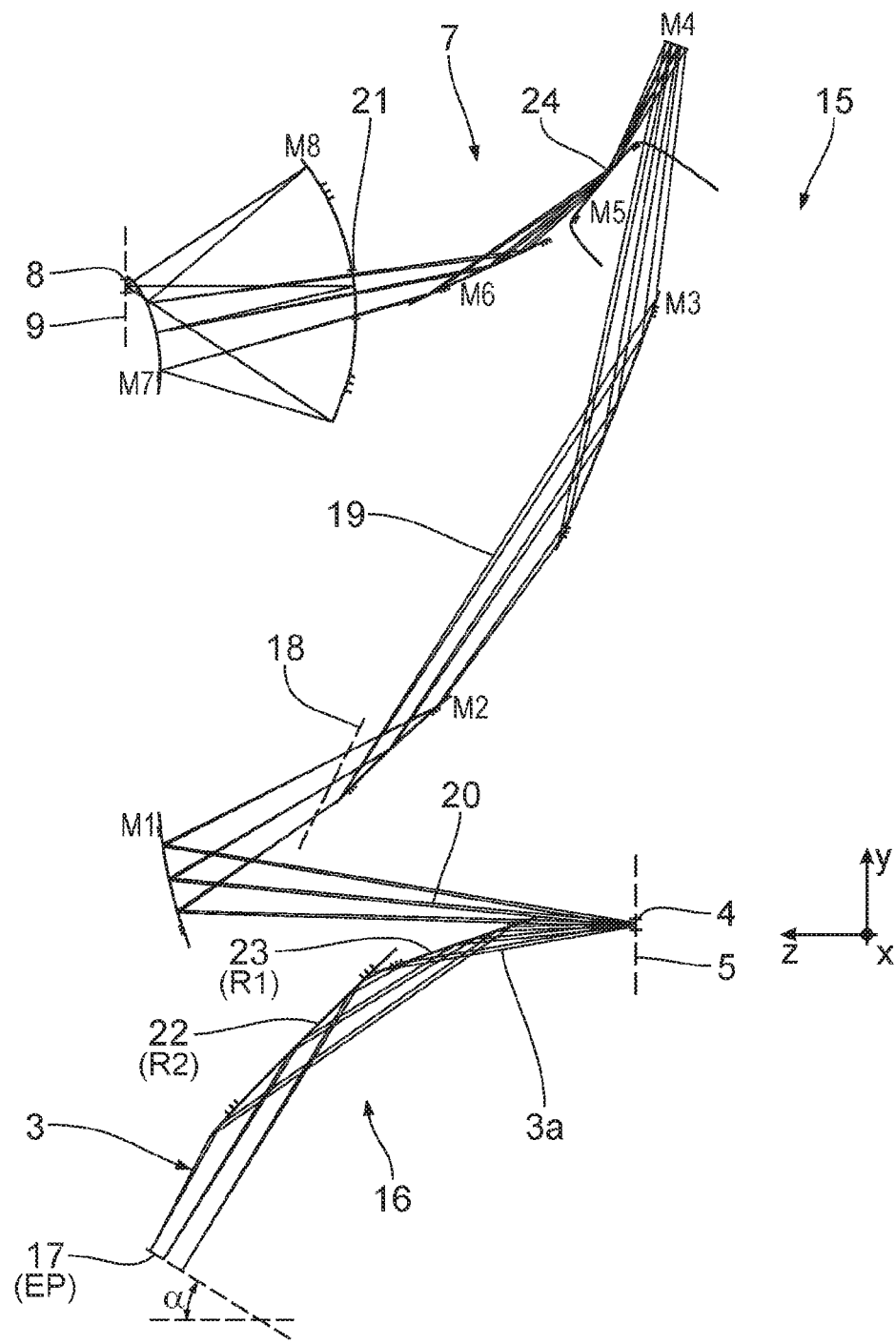
FIG. 2 shows, in a meridional section, an embodiment of an optical subsystem with an imaging optical unit, which is usable as a projection lens in the projection exposure apparatus according to FIG. 1, wherein an imaging beam path for chief rays and for respectively an upper and a lower coma ray from two selected field points is depicted.

One of the exemplary embodiments depicted in FIG. 2 et seq. can be used for the projection optical unit 7. The projection optical unit 7 has a reducing imaging scale of 8× in the yz-plane and a reducing imaging scale of 4× in the xz-plane. Therefore, the projection optical unit 7 is anamorphic. An illumination angle bandwidth of an illumination light overall beam $3_G$ composed of the illumination channels is smaller for a plane of incidence yz (plane of the drawing in FIG. 2) of the illumination light 3 on the object field 4 parallel to the object displacement direction y than for an xz-plane extending perpendicular thereto. Alternatively, an isomorphic projection optical unit is also possible. Other reduction scales are also possible, for example 4×, 5× or even reduction scales which are greater than 8×. When an anamorphic projection optical unit is used, the values specified above apply to the reduction scales for the xz-plane or for the yz-plane. In the embodiments of the projection optical unit 7 according to FIGS. 2 and 5 et seq., the image plane 9 is arranged parallel to the object plane 5. What is imaged in this case is a section of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and of the substrate 11 in the y-direction is effected between individual exposures of the substrate 11, is also possible. These displacements are effected synchronously to one another by an appropriate actuation of the displacement drives 10b and 12a.

FIG. 2 shows the optical design of a first embodiment of an optical subsystem 15, which also includes an imaging optical subunit 16 in addition to the projection optical unit 7, which imaging optical subunit images an arrangement plane 17 lying upstream of the object field 4 in the beam path of the imaging light 3 into an entry pupil or entry pupil plane 18 of the projection optical unit 7. The entry pupil need not lie in one plane. Alternatively, the entry pupil can also be configured as a surface lying in a non-planar three-dimensional manner in space. Furthermore, in respect of the beams of the imaging light 3 extending in the yz-plane, the entry pupil can also lie at a different position than in respect of the plane of extent of the beams of the imaging light 3 perpendicular thereto. Thus, it is not necessarily possible to provide a closed surface description of an extent of the entry pupil for all beams of the imaging light 3.

The location of the entry pupil plane 18 is indicated very schematically in FIG. 2. For rays of the imaging light 3 which extend in planes perpendicular to the plane of the drawing in FIG. 2, the entry pupil of the projection optical unit 7 lies offset to the location of the pupil plane 18 between the mirrors M1 and M2, which is plotted in FIG. 2 and predetermined there by the position of intersections of the chief rays and coma rays of the imaging light. The spacing of the entry pupils, firstly for rays of the imaging light 3 in the yz-plane and, secondly, in a plane of extent perpendicular thereto, may be significant and can differ along the beam path of the imaging light 3 by several 100 mm and even by an even larger value, for example by several 1000 mm. Proceeding from the object plane 5 in the beam direction of chief rays of the imaging light 3, a position of the entry pupils EPy (location in the yz-plane) and EPx (position in the plane of extent of the imaging light 3 perpendicular thereto) may, independently of one another, lie in the range between 300 mm and infinity. Here, the value "infinity" denotes an object-side telecentric configuration of the projection optical unit 7.

The imaging optical subunit 16 deflects imaging light 3 in the beam path upstream of the object field 4 only in a grazing manner, i.e. with angles of incidence of greater than 60°.

FIG. 2 depicts the beam path of in each case three individual rays 19 emanating from two object field points which are spaced apart from one another in the y-direction in FIG. 2. Depicted here are chief rays 20, i.e. individual rays 19 which extend through the centre of the pupil 18 of the projection optical unit 7, and, in each case, an upper and a lower coma ray of these two object field points. Proceeding from the object field 4, the chief rays 20 include an angle CRAO of 5.5° with a normal of the object plane 5.

The object plane 5 lies parallel to the image plane 9.

The projection optical unit 7 has an image-side numerical aperture of 0.55.

The projection optical unit 7 according to FIG. 2 has a total of eight mirrors, which, proceeding from the object field 4, are numbered M1 to M8 in the sequence of the beam path of the individual rays 19. A variant of the imaging optical unit 7 may also have a different number of mirrors, for example four mirrors or six mirrors. Depending on the embodiment, the projection optical unit 7 can have an isomorphic or anamorphic configuration.

FIG. 2 depicts the calculated reflection surfaces of the mirrors M1 to M8. What can be identified in the illustration according to FIG. 2 is that only a portion of these calculated reflection surfaces is used. Only this actually used region of the reflection surfaces is actually present in the real mirrors M1 to M8. These used reflection surfaces are carried in a known manner by mirror bodies.

In the projection optical unit 7 according to FIG. 2, the mirrors M1, M4, M7 and M8 are configured as mirrors for normal incidence, that is to say as mirrors onto which the imaging light 3 impinges with an angle of incidence that is smaller than 45°. Thus, overall, the projection optical unit 7 according to FIG. 2 has four mirrors M1, M4, M7 and M8 for normal incidence.

The mirrors M2, M3, M5 and M6 are mirrors for grazing incidence of the illumination light 3, that is to say mirrors onto which the illumination light 3 impinges with angles of incidence that are greater than 60°. A typical angle of incidence of the individual rays 19 of the imaging light 3 on the mirrors M2, M3 and M5, M6 for grazing incidence lies in the region of 80°. Overall, the projection optical unit 7 according to FIG. 2 has exactly four mirrors M2, M3, M5 and M6 for grazing incidence.

The mirrors M2 and M3 form a mirror pair arranged directly in succession in the beam path of the imaging light 3. The mirrors M5 and M6 also form a mirror pair arranged directly in succession in the beam path of the imaging light 3.

The mirror pairs M2, M3 on the one hand and M5, M6 on the other hand reflect the imaging light 3 in such a way that the angles of reflection of the individual rays 19 add up at the respective mirrors M2, M3 and M5, M6 of these two mirror pairs. Thus, the respective second mirror M3 and M6 of the respective mirror pair M2, M3 and M5, M6 increases a deflecting effect which the respective first mirror M2, M5 exerts on the respective individual ray 19. This arrangement of the mirrors of the mirror pairs M2, M3 and M5, M6 corresponds to that described in DE 10 2009 045 096 A1 for an illumination optical unit.

The mirrors M2, M3, M5 and M6 for grazing incidence each have very large absolute values for the radius, that is to say they have a relatively small deviation from a planar surface. These mirrors M2, M3, M5 and M6 for grazing incidence thus have practically no refractive power, that is to say practically no overall beam-forming effect like a concave or convex mirror, but rather contribute to specific and, in particular, local aberration correction.

The mirrors M1 to M8 carry a coating optimizing the reflectivity of the mirrors M1 to M8 for the imaging light 3. This can be a ruthenium coating, a molybdenum coating or a molybdenum coating with an uppermost layer of ruthenium. In the mirrors M2, M3, M5 and M6 for grazing incidence, use can be made of a coating with e.g. one ply of molybdenum or ruthenium. These highly reflecting layers, in particular of the mirrors M1, M4, M7 and M8 for normal incidence, can be configured as multi-ply layers, wherein successive layers can be manufactured from different materials. Alternating material layers can also be used. A typical multi-ply layer can have fifty bilayers, respectively made of a layer of molybdenum and a layer of silicon.

The mirror M8, that is to say the last mirror upstream of the image field 8 in the imaging beam path, has a passage opening 21 for the passage of imaging light 3 which is reflected from the antepenultimate mirror M6 toward the penultimate mirror M7. The mirror M8 is used in a reflective manner around the passage opening 21. All other mirrors M1 to M7 do not have a passage opening and are used in a reflective manner in a region connected in a gap-free manner.

The imaging optical subunit 16 deflects imaging light 3 in the beam path upstream of the object field 4 only in a grazing manner. In the embodiment according to FIG. 2, the imaging optical subunit 16 includes exactly two mirrors for grazing incidence (GI mirrors) 22 and 23. These two mirrors 22 and 23 are in turn configured as a mirror pair in such a way that the imaging light 3 is reflected with angles of reflections that add at the GI mirrors 22 and 23. What was explained above in relation to the mirror pairs M2, M3 and M5, M6 also applies here. The GI mirrors 22, 23 of the imaging optical subunit 16 deflect the illumination light 3 in the clockwise direction in the view according to FIG. 2.

Overall, imaging of the arrangement plane 17 into the pupil plane 18 of the entry pupil is brought about by the two GI mirrors 22, 23 of the imaging optical subunit 16 and by the mirror M1 of the projection optical unit 7.

The mirror M1 alone also has an imaging effect in relation to the entry pupil of the projection optical unit 7, which, in the plane of the drawing depicted e.g. in FIG. 2, lies in the pupil plane 18. The mirror M1 produces a virtual image of this entry pupil, which, proceeding from the object field 4 in the beam path of the imaging light 3, lies at a distance of 7275 mm from the object field 4 in view of the entry pupil position in the yz-plane and lies at a distance of 4565 mm from the object field 4 in the plane of extent of the imaging light 3 perpendicular thereto. The two mirrors 22, 23 for grazing incidence image this virtual location of the entry pupil, which is produced by way of the mirror M1, into the arrangement plane 17.

The optical subsystem 15 is configured as catoptric optical unit.

The two GI mirrors 22, 23 are arranged directly in succession in the beam path of the imaging light 3.

A folding plane of the two GI mirrors 22, 23 lies in the yz-plane. The two GI mirrors 22, 23 belong to the illumination optical unit 6.

A pupil facet mirror of the illumination optical unit 6 is arranged in the arrangement plane 17. In FIG. 1, the pupil facet mirror is indicated schematically at PF and a field facet mirror is indicated schematically at FF within the illumination optical unit 6. The pupil facet mirror PF lies in the arrangement plane 17.

Moreover, the two GI mirrors 22, 23, together with the pupil facet mirror PF, are part of a transmission optical unit, which images the field facets of the field facet mirror FF superposed on one another in the object field 4 by way of illumination channels, which each have assigned to them one of the field facets and one of the pupil facets.

Illumination optical units with a field facet mirror and a pupil facet mirror are known from the prior art. An illumination angle distribution in the case of an object field illumination can be predetermined by way of illuminating pupil facets of the pupil facet mirror. The pupil facet mirror is part of an imaging optical unit, which images field facets of the field facet mirror in a mutually superposed manner onto the object field. The GI mirrors 22 and 23 are then also part of this imaging optical unit for the field facets. The field facets can each be constructed from a plurality of micromirrors. The field facets can have an x/y-aspect ratio that is greater than an x/y-aspect ratio of the object field 4.

A totality of the pupil facets on the pupil facet mirror PF has an edge contour with an aspect ratio x/y between an extent x perpendicular to the object displacement direction y and an extent y parallel to the object displacement direction, which is less than an aspect ratio sigmax/sigmay between dimensions of an illumination pupil of the illumination optical unit 6 in the arrangement plane 17. These dimensions sigmax and sigmay are assigned to the extents x and y of the edge contour perpendicular and parallel to the object displacement direction y.

The mirrors 22, 23 and the mirrors M1 to M8 are embodied as free-form surfaces which are not describable by a rotationally symmetric function. Other embodiments of the optical subsystem 15, in which at least one of the mirrors 22, 23, M1 to M8 is embodied as a rotationally symmetric asphere, are also possible. All mirrors 22, 23, M1 to M8 can also be embodied as such aspheres.

A free-form surface can be described by the following free-form surface equation (equation 1):

$$Z = \frac{c_x x^2 + c_y y^2}{1 + \sqrt{1 - (1+k_x)(c_x x)^2 - (1+k_y)(c_y y)^2}} + \quad (1)$$
$$C_1 x + C_2 y + C_3 x^2 + C_4 xy + C_5 y^2 + C_6 x^3 + \ldots +$$
$$C_9 y^3 + C_{10} x^4 + \ldots + C_{12} x^2 y^2 + \ldots + C_{14} y^4 + C_{15} x^5 +$$
$$\ldots + C_{20} y^5 + C_{21} x^6 + \ldots + C_{24} x^3 y^3 + \ldots + C_{27} y^6 + \ldots$$

The following applies to the parameters of this equation (1):

Z is the sag of the free-form surface at the point x, y, where $x^2+y^2=r^2$. Here, r is the distance from the reference axis of the free-form surface equation (x=0; y=0).

In the free-form surface equation (1), $C_1$, $C_2$, $C_3$ . . . denote the coefficients of the free-form surface series expansion in powers of x and y.

In the case of a conical base area, $c_x$, $c_y$ is a constant corresponding to the vertex curvature of a corresponding asphere. Thus, $c_x=1/R_x$ and $c_y=1/R_y$ applies. $k_x$ and $k_y$ each correspond to a conical constant of a corresponding asphere. Thus, equation (1) describes a bi-conical free-form surface.

An alternative possible free-form surface can be generated from a rotationally symmetric reference surface. Such free-form surfaces for reflection surfaces of the mirrors of projection optical units of microlithographic projection exposure apparatuses are known from US 2007-0058269 A1. Such free-form surfaces can also be used for the two GI mirrors 22, 23.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and the gradients associated therewith. Depending on the respective type of the spline surface, the complete surface is obtained by interpolation between the grid points using e.g. polynomials or functions which have specific properties in respect of the continuity and the differentiability thereof. Examples for this are analytical functions.

The optical design data of the reflection surfaces of the mirrors 22, 23, M1 to M8 of the projection optical unit 7 can be gathered from the following tables. Here, the GI mirror 23 is denoted by R1 and the GI mirror 22 is denoted by R2. These optical design data in each case proceed from the image plane 9, i.e. describe the respective projection optical unit in the reverse propagation direction of the imaging light 3 between the image plane 9 and the object plane 5 and onward to the arrangement plane 17, which is denoted by "EP" in the tables.

The first one of these tables specifies vertex radii $Radius_x$ and $Radius_y$, firstly in the xy-plane and secondly in the yz-plane, for the optical surfaces of the optical components. Moreover, this Table 1 specifies refractive power values $Power_x$ and $Power_y$. Here, the following applies:

Power=−2 cos(AOI)/radius

Here, AOI denotes an angle of incidence of a chief ray of a central field point on the respective mirror.

"inf" denotes "infinity".

The second table specifies, for the mirrors M1 to M8 in mm, the conical constants $k_x$ and $k_y$, the vertex radius $R_x$ possibly deviating from the value R ($=R_y$) and the free-form surface coefficients $C_n$. Coefficients $C_n$ not listed here are zero.

The third table still specifies the magnitude along which the respective functional component of the projection optical unit 7, i.e. the respective mirror, the respective field, the stop AS and the arrangement plane EP, proceeding from a reference surface, was decentred (DCY) in the y-direction, and displaced (DCZ) and tilted (TLA, TLC) in the z-direction. This corresponds to a parallel displacement and a tilt when carrying out the free-form surface design method. Here, a displacement is carried out in the y-direction and in the z-direction in mm, and tilting is carried out about the x-axis and about the z-axis. Here, the tilt angle is specified in degrees. Decentring is carried out first, followed by tilting. The reference surface during decentring is in each case the first surface of the specified optical design data. Decentring in the y-direction and in the z-direction is also specified for the object field 4.

The fourth table still specifies the transmission data of the mirrors and of the reflecting reticle 10 in the object field 4, namely the reflectivity thereof for the angle of incidence of an illumination light ray incident centrally on the respective mirror. The overall transmission is specified as a proportional factor remaining from an incident intensity after reflection at all mirrors in the projection optical unit.

The fifth table specifies the x-coordinates and the y-coordinates of a polygonal chain, which describes a beam-delimiting edge contour of an aperture stop AS which is arranged in a pupil within the projection optical unit 7.

The sixth table accordingly specifies the x-coordinates and the y-coordinates of a polygonal chain, which describes a beam-delimiting edge contour of a pupil EP which lies in the arrangement plane 17.

| Table 1 for FIG. 2 | | | | | |
|---|---|---|---|---|---|
| Surface | Radius_x[mm] | Power_x[1/mm] | Radius_y[mm] | Power_y[1/mm] | Operating mode |
| M8 | −1086.4611611 | 0.0018289 | −972.4519818 | 0.0020701 | REFL |
| M7 | 3808.6422450 | −0.0005251 | 653.5434149 | −0.0030606 | REFL |
| M6 | 6571.6881729 | −0.0000698 | 4255202.7145080 | −0.0000020 | REFL |
| M5 | 16343.8812076 | −0.0000267 | 8842.9581526 | −0.0010356 | REFL |
| M4 | −2801.5176799 | 0.0007060 | −2883.9121273 | 0.0007013 | REFL |
| M3 | −7809.8432518 | 0.0000540 | −13643.9333936 | 0.0006949 | REFL |
| M2 | −4671.3804369 | 0.0000926 | 5516.8925603 | −0.0016768 | REFL |
| M1 | −5373.8188638 | 0.0003535 | −1892.3506778 | 0.0011127 | REFL |
| Object field | 0.0000000 | −inf | 0.0000000 | −inf | REFL |
| R1 | −810.4757019 | 0.0005551 | −22084.4193732 | 0.0004026 | REFL |
| R2 | −685.0690764 | 0.0006567 | −14611.5384624 | 0.0006085 | REFL |

| Table 2a for FIG. 2 | | | |
|---|---|---|---|
| Coefficient | M8 | M7 | M6 |
| KY | 0.00000000 | 0.00000000 | 0.00000000 |
| KX | 0.00000000 | 0.00000000 | 0.00000000 |
| RX | −1086.46116100 | 3808.64224500 | 6571.68817300 |
| C7 | −1.1078969e−08 | 6.1425387e−08 | 1.82371233e−08 |
| C9 | −1.17534229e−08 | −3.42808539e−07 | −5.80964859e−08 |
| C10 | −8.37241187e−12 | 3.61372227e−10 | 5.3783797e−11 |
| C12 | −3.1970363e−11 | 1.47484546e−09 | −4.24496085e−11 |
| C14 | −8.21547285e−12 | 1.188668e−09 | −1.04978605e−10 |
| C16 | −1.04304709e−14 | −2.38048085e−13 | −2.29871256e−13 |
| C18 | −1.34057223e−14 | −7.2303484e−13 | −4.2481412e−16 |
| C20 | −8.89787775e−15 | −2.12104825e−12 | −2.3111532e−13 |
| C21 | −1.30253203e−17 | 1.04740546e−16 | −9.22997742e−16 |
| C23 | −5.19021194e−17 | 4.08871039e−15 | 5.59688799e−16 |
| C25 | −4.71651147e−17 | 9.01468915e−15 | −5.10271963e−17 |
| C27 | −1.19961306e−17 | 9.82559639e−15 | −5.48583806e−16 |
| C29 | −6.48351789e−21 | 7.08629717e−19 | 6.00807204e−19 |
| C31 | −1.36884382e−20 | 1.61371795e−18 | −1.7656167e−18 |
| C33 | −1.87761592e−20 | −1.14613155e−17 | −8.36203437e−20 |
| C35 | −8.27081439e−21 | −2.8051096e−17 | −1.37212193e−18 |
| C36 | −1.02979374e−23 | 2.25551389e−21 | −2.12910658e−21 |
| C38 | −6.46837561e−23 | 1.534741e−20 | −2.43916278e−20 |
| C40 | −9.82548812e−23 | 3.25407025e−20 | −1.36924303e−20 |
| C42 | −6.44090314e−23 | 1.0558405e−19 | −2.29029353e−21 |
| C44 | −1.45370812e−23 | 1.51958388e−19 | −3.30322739e−21 |
| C46 | −1.39270495e−26 | −4.35161084e−24 | 1.06285855e−21 |
| C48 | −1.39387737e−26 | −1.92794968e−23 | 4.00306806e−22 |
| C50 | −2.97964394e−26 | −2.03709958e−23 | 1.49782759e−23 |
| C52 | −2.72575255e−26 | −3.68483462e−22 | −1.10193538e−23 |
| C54 | −8.6352343e−27 | −6.37462023e−22 | −6.88052798e−24 |
| C55 | −1.32830438e−29 | −1.50026844e−26 | −8.1823714e−25 |
| C57 | −5.96071984e−29 | −4.04299032e−26 | −2.15991524e−24 |
| C59 | −1.68890534e−28 | 2.12934794e−26 | 1.69146506e−24 |

Table 2a for FIG. 2

| Coefficient | M8 | M7 | M6 |
|---|---|---|---|
| C61 | −1.79122165e−28 | 2.09943794e−25 | 6.14483729e−25 |
| C63 | −8.48827493e−29 | 8.25710247e−25 | 1.01264754e−26 |
| C65 | −1.40437102e−29 | 7.4409807e−25 | −1.80606728e−26 |
| C67 | 4.70318894e−33 | 3.06925048e−29 | −8.92185705e−26 |
| C69 | −2.46712869e−32 | 1.2632953e−28 | −4.16014097e−26 |
| C71 | −5.57262985e−32 | −6.12012733e−28 | −8.88184517e−27 |
| C73 | −6.66391594e−32 | −3.99345995e−27 | 6.81045792e−28 |
| C75 | −3.47802661e−32 | 7.76870707e−28 | 1.73773844e−28 |
| C77 | −8.35519554e−33 | 9.09418801e−27 | −8.93448769e−29 |
| C78 | −1.6465196e−35 | 1.46055139e−31 | 1.37466252e−28 |
| C80 | −1.30360856e−34 | 7.02584253e−31 | 3.63314891e−28 |
| C82 | −2.28008125e−34 | 2.60497458e−30 | −5.77785744e−29 |
| C84 | −2.54506452e−34 | 8.67596903e−30 | −6.27407486e−29 |
| C86 | −2.2597282e−34 | 3.76767639e−29 | −8.27779072e−30 |
| C88 | −1.25508542e−34 | 6.52262748e−29 | 2.416286e−31 |
| C90 | −2.82929706e−35 | 2.11073828e−29 | −3.5146899e−31 |
| C92 | −4.02238973e−39 | −1.85734874e−34 | 2.55717195e−30 |
| C94 | 1.19294193e−38 | 9.57693001e−35 | 1.68168588e−30 |
| C96 | 3.27086695e−38 | 3.27223066e−33 | 6.05704826e−31 |
| C98 | 2.06145244e−38 | 1.29986711e−32 | 5.57919846e−32 |
| C100 | −1.83126486e−38 | −1.44171657e−31 | −2.19408614e−32 |
| C102 | −2.15511115e−38 | −6.37837969e−31 | −6.75987802e−34 |
| C104 | 2.36907018e−39 | −4.7170814e−31 | −7.13753861e−34 |
| C105 | 1.81526514e−41 | −6.02453793e−37 | −4.70636081e−33 |
| C107 | 1.43676376e−40 | −2.24384261e−36 | −1.47641125e−32 |
| C109 | 5.03160264e−41 | −1.1200142e−35 | −2.52005625e−33 |
| C111 | −4.25097822e−40 | −3.63684011e−35 | 1.32282749e−33 |
| C113 | −5.26473813e−40 | −6.09102975e−35 | 5.94007824e−34 |
| C115 | −2.11919681e−40 | 3.90152954e−34 | −1.19939381e−35 |
| C117 | 8.97051887e−42 | 1.70870476e−33 | −1.52993377e−36 |
| C119 | 1.75055128e−41 | 1.1650811e−33 | −5.68798769e−37 |
| C121 | −2.93350402e−44 | 0 | 0 |
| C123 | −1.05094157e−43 | 0 | 0 |
| C125 | −3.14894595e−43 | 0 | 0 |
| C127 | −5.48359932e−43 | 0 | 0 |
| C129 | −6.25681403e−43 | 0 | 0 |
| C131 | −4.39064004e−43 | 0 | 0 |
| C133 | −1.80703271e−43 | 0 | 0 |
| C135 | −4.37968799e−44 | 0 | 0 |
| C136 | −3.93005436e−47 | 0 | 0 |
| C138 | −4.54687333e−46 | 0 | 0 |
| C140 | −1.34704138e−45 | 0 | 0 |
| C142 | −2.04150203e−45 | 0 | 0 |
| C144 | −2.45288315e−45 | 0 | 0 |
| C146 | −2.37914112e−45 | 0 | 0 |
| C148 | −1.50410101e−45 | 0 | 0 |
| C150 | −5.52739987e−46 | 0 | 0 |
| C152 | −8.512091e−47 | 0 | 0 |

Table 2b for FIG. 2

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 16343.88121000 | −2801.51768000 | −7809.84325200 |
| C7 | −1.10965457e−07 | −5.49348726e−08 | −7.87828654e−09 |
| C9 | −1.25907335e−07 | −4.12933208e−07 | 2.4781076e−09 |
| C10 | −3.92110745e−11 | 6.07658201e−12 | −1.91079829e−11 |
| C12 | 5.23014109e−11 | 1.64514883e−10 | −6.30824537e−12 |
| C14 | 2.50093533e−10 | 1.29540533e−09 | −5.20694636e−12 |
| C16 | 1.86498832e−13 | −1.81127137e−14 | 1.73742328e−14 |
| C18 | −6.31762116e−14 | −1.00403595e−12 | −3.63759365e−15 |
| C20 | −6.98868586e−13 | −6.72836127e−12 | 1.14564832e−15 |
| C21 | 1.72966192e−17 | 2.59789654e−18 | −8.02993793e−18 |
| C23 | −5.90331771e−16 | 2.01564306e−16 | −9.20462505e−18 |
| C25 | −1.29145765e−16 | 5.15763711e−15 | −6.00142744e−19 |
| C27 | 2.06203595e−15 | 3.63161954e−14 | −1.8520942e−18 |
| C29 | −3.95281132e−19 | −2.68183719e−20 | −7.40920328e−21 |
| C31 | 1.714981e−18 | −1.28423127e−18 | 3.5968728e−21 |
| C33 | 1.80327017e−18 | −3.02419058e−17 | −2.74416133e−21 |
| C35 | −7.67656461e−18 | −1.98861785e−16 | 6.72718889e−22 |

Table 2b for FIG. 2

| Coefficient | M5 | M4 | M3 |
|---|---|---|---|
| C36 | 9.82111585e-23 | 1.14480689e-24 | 1.00234478e-23 |
| C38 | 4.16328299e-21 | 2.58889105e-22 | 1.97817878e-24 |
| C40 | 1.57117119e-20 | 1.47324398e-20 | -1.16696762e-24 |
| C42 | -3.12592724e-21 | 2.38594079e-19 | 1.33781597e-24 |
| C44 | -3.40161379e-21 | 1.07030744e-18 | -8.35673902e-25 |
| C46 | -2.14506084e-24 | -2.7999629e-26 | 2.73246982e-26 |
| C48 | -2.34381906e-23 | -3.19631053e-24 | 4.79306206e-26 |
| C50 | -1.597377e-22 | -2.01786673e-22 | 6.2452675e-27 |
| C52 | -1.96985726e-22 | -3.82500804e-21 | 8.14481514e-28 |
| C54 | 4.42267894e-22 | -2.05070226e-20 | 8.93396572e-28 |
| C55 | -8.63735394e-28 | -6.79542983e-31 | -2.79803878e-29 |
| C57 | -4.91461419e-26 | -2.95814636e-28 | -2.72787531e-29 |
| C59 | -1.05919827e-24 | 1.77272076e-27 | -9.25850169e-29 |
| C61 | -1.38814922e-24 | 8.30985264e-25 | -2.14557337e-29 |
| C63 | 1.03640803e-24 | 3.0972763e-23 | -3.89172059e-30 |
| C65 | 6.34506914e-24 | 1.13974595e-22 | -1.18044099e-30 |
| C67 | 5.18048446e-29 | 8.21614495e-32 | -2.64094328e-31 |
| C69 | 3.03900291e-28 | 6.35950317e-30 | -3.32079144e-31 |
| C71 | 5.92229453e-27 | 7.18315191e-28 | -1.14334021e-32 |
| C73 | 9.72207365e-27 | 3.19512409e-26 | -2.1934315e-32 |
| C75 | 2.29485906e-26 | 6.05206622e-25 | -1.19878684e-32 |
| C77 | -8.57374765e-26 | 2.58134735e-24 | -8.98158904e-35 |
| C78 | -1.67738796e-32 | 1.99989011e-35 | 8.03048239e-35 |
| C80 | 4.12176147e-31 | 1.45861471e-33 | 5.91901438e-34 |
| C82 | 2.27271195e-29 | 1.58451766e-32 | 7.10230235e-34 |
| C84 | 9.28512559e-29 | -8.69815659e-31 | 1.81300953e-34 |
| C86 | -5.39439677e-29 | -3.49997695e-28 | 7.70334498e-35 |
| C88 | 2.02810667e-28 | -5.38965698e-27 | 2.00479637e-35 |
| C90 | -1.12387699e-27 | -1.30743871e-26 | 8.90718756e-37 |
| C92 | -4.82330886e-35 | 1.5386021e-37 | 1.20714309e-36 |
| C94 | -3.40595694e-34 | -2.14696562e-35 | 1.0968559e-36 |
| C96 | -5.75090617e-32 | -2.7796024e-33 | 9.91575934e-38 |
| C98 | -2.69060475e-31 | -1.7826322e-31 | 8.6586438e-38 |
| C100 | 8.31565611e-32 | -5.72702642e-30 | 6.22618467e-38 |
| C102 | -1.96771836e-30 | -6.84918847e-29 | 1.57883694e-38 |
| C104 | 5.50536999e-30 | -2.429736e-28 | 5.09552446e-40 |
| C105 | 4.8600456e-38 | 9.98338016e-42 | -8.16439035e-40 |
| C107 | -3.57700431e-36 | -1.77499185e-39 | -2.47232953e-39 |
| C109 | -1.70010401e-34 | 3.44595544e-37 | -2.3863755e-39 |
| C111 | -1.2526717e-33 | 1.40384441e-35 | -6.59437112e-40 |
| C113 | -1.87215464e-33 | 2.19468935e-33 | -3.48407985e-40 |
| C115 | 5.40678903e-33 | 6.10947816e-32 | -1.50248317e-40 |
| C117 | -2.43438871e-32 | 5.78093221e-31 | -2.75106593e-41 |
| C119 | 7.26755941e-32 | 2.06443218e-30 | -1.07946235e-42 |

Table 2c for FIG. 2

| Coefficient | M2 | M1 | Object field |
|---|---|---|---|
| C107 | 2.66086801e-37 | 2.2582854e-37 | 0 |
| C109 | 8.24327535e-37 | 1.14971623e-36 | 0 |
| C111 | 1.23182119e-36 | 8.08113624e-36 | 0 |
| C113 | 1.15154156e-36 | 2.83554362e-35 | 0 |
| C115 | 6.62471095e-37 | 6.69318428e-35 | 0 |
| C117 | 1.96902426e-37 | 1.14634943e-34 | 0 |
| C119 | 1.16401567e-38 | 1.12393619e-34 | 0 |

Table 2d for FIG. 2

| Coefficient | R1 | R2 |
|---|---|---|
| KY | 0.00000000 | 0.00000000 |
| KX | 0.00000000 | 0.00000000 |
| RX | -810.47570190 | -685.06907640 |
| C7 | -2.10212477e-07 | -3.34892309e-07 |
| C9 | 6.16621119e-09 | -2.23123792e-08 |
| C10 | -9.5360015e-11 | 1.92924322e-10 |
| C12 | 1.02133113e-10 | -4.00432374e-10 |
| C14 | 2.12492853e-11 | -2.93206249e-11 |

Table 3a for FIG. 2

| Surface | DCX | DCY | DCZ |
|---|---|---|---|
| Image field | 0.00000000 | 0.00000000 | 0.00000000 |
| M8 | 0.00000000 | 0.00000000 | 883.01010398 |
| M7 | 0.00000000 | -177.89017059 | 116.87680237 |
| M6 | -0.00000000 | 83.63075268 | 1423.22180879 |
| M5 | -0.00000000 | 408.52790285 | 1841.36054162 |
| M4 | 0.00000000 | 937.33840609 | 2109.89445971 |
| M3 | 0.00000000 | -577.89935653 | 1846.86407552 |
| M2 | 0.00000000 | -1785.41125401 | 1026.16189129 |
| AS | 0.00000000 | -1923.74254884 | 794.34985948 |
| M1 | 0.00000000 | -2297.47393643 | 168.06039680 |
| Object field | 0.00000000 | -2474.44854338 | 1968.30324862 |
| R1 | 0.00000000 | -2546.30347262 | 1272.00096574 |

TABLE 3a for FIG. 2

| Surface | DCX | DCY | DCZ |
|---|---|---|---|
| R2 | 0.00000000 | −2916.12508547 | 677.66774720 |
| EP | 0.00000000 | −3763.17079749 | 146.14769889 |

TABLE 3b for FIG. 2

| Surface | TLA[deg] | TLB[deg] | TLC[deg] |
|---|---|---|---|
| Image field | −0.00000000 | 0.00000000 | −0.00000000 |
| M8 | −6.53600000 | 0.00000000 | −0.00000000 |
| M7 | 167.80372184 | 0.00000000 | −0.00000000 |
| M6 | 65.41597514 | 0.00000000 | 0.00000000 |
| M5 | 39.53715330 | 0.00000000 | −0.00000000 |
| M4 | −71.61517505 | −0.00000000 | 0.00000000 |
| M3 | 22.02518991 | 0.00000000 | −0.00000000 |
| M2 | 46.68817593 | 0.00000000 | 0.00000000 |
| AS | 26.73600574 | 180.00000000 | −0.00000000 |
| M1 | 167.39414943 | −0.00000000 | 0.00000000 |
| Object field | −0.13865353 | 0.00000000 | 0.00000000 |
| R1 | 71.10821601 | 180.00000000 | 0.00000000 |
| R2 | 225.10821601 | −0.00000000 | 0.00000000 |
| EP | −57.89178399 | 180.00000000 | −0.00000000 |

TABLE 4 for FIG. 2

| Surface | AOI[deg] | Reflectivity |
|---|---|---|
| M8 | 6.53600000 | 0.66118877 |
| M7 | 0.87572184 | 0.66562486 |
| M6 | 76.73653145 | 0.83201657 |
| M5 | 77.38464670 | 0.84182272 |
| M4 | 8.53697505 | 0.65781123 |
| M3 | 77.82265999 | 0.84825953 |
| M2 | 77.51435400 | 0.84374430 |
| M1 | 18.22032750 | 0.62403410 |
| RET | 5.75313046 | 0.66224263 |
| R1 | 77.00000000 | 0.83604493 |
| R2 | 77.00000000 | 0.83604493 |
| Overall transmission | | 0.0419 |

TABLE 5 for FIG. 2

| X[mm] | Y[mm] | Z[mm] |
|---|---|---|
| 0.00000000 | −140.70627088 | 0.00000000 |
| 42.06645921 | −138.67828550 | 0.00000000 |
| 83.29373531 | −132.66199893 | 0.00000000 |
| 122.85149629 | −122.85886356 | 0.00000000 |
| 159.92516689 | −109.59845855 | 0.00000000 |
| 193.71997126 | −93.32713663 | 0.00000000 |
| 223.46302830 | −74.58977226 | 0.00000000 |
| 248.40636574 | −54.00526307 | 0.00000000 |
| 267.83549770 | −32.23694377 | 0.00000000 |
| 281.08924758 | −9.95662831 | 0.00000000 |
| 287.59506690 | 12.19496306 | 0.00000000 |
| 286.91965708 | 33.64165594 | 0.00000000 |
| 278.82733089 | 53.89055750 | 0.00000000 |
| 263.33049358 | 72.53361583 | 0.00000000 |
| 240.71526695 | 89.23810123 | 0.00000000 |
| 211.53430161 | 103.73531175 | 0.00000000 |
| 176.57192324 | 115.81429443 | 0.00000000 |
| 136.79505585 | 125.32086704 | 0.00000000 |
| 93.30387089 | 132.15676822 | 0.00000000 |
| 47.28956547 | 136.27122002 | 0.00000000 |
| 0.00000000 | 137.64420761 | 0.00000000 |
| −47.28956547 | 136.27122002 | 0.00000000 |
| −93.30387089 | 132.15676822 | 0.00000000 |
| −136.79505585 | 125.32086704 | 0.00000000 |
| −176.57192324 | 115.81429443 | 0.00000000 |
| −211.53430161 | 103.73531175 | 0.00000000 |
| −240.71526695 | 89.23810123 | 0.00000000 |
| −263.33049358 | 72.53361583 | 0.00000000 |
| −278.82733089 | 53.89055750 | 0.00000000 |
| −286.91965708 | 33.64165594 | 0.00000000 |
| −287.59506690 | 12.19496306 | 0.00000000 |
| −281.08924758 | −9.95662831 | 0.00000000 |
| −267.83549770 | −32.23694377 | 0.00000000 |
| −248.40636574 | −54.00526307 | 0.00000000 |
| −223.46302830 | −74.58977226 | 0.00000000 |
| −193.71997126 | −93.32713663 | 0.00000000 |
| −159.92516689 | −109.59845855 | 0.00000000 |
| −122.85149629 | −122.85886356 | −0.00000000 |
| −83.29373531 | −132.66199893 | 0.00000000 |
| −42.06645921 | −138.67828550 | 0.00000000 |
| 0.00000000 | 60.86400238 | 0.00000000 |
| −21.87104444 | 59.24605219 | 0.00000000 |
| −43.05958708 | 54.54074614 | 0.00000000 |
| −62.94892446 | 47.16610535 | 0.00000000 |
| −81.02923110 | 37.73565917 | 0.00000000 |
| −96.90526492 | 26.95859963 | 0.00000000 |
| −110.27862576 | 15.53558598 | 0.00000000 |
| −120.91931056 | 4.06854295 | 0.00000000 |
| −128.64027726 | −7.00096903 | 0.00000000 |
| −133.28450320 | −17.41593015 | 0.00000000 |
| −134.72873359 | −27.08827008 | 0.00000000 |
| −132.90215523 | −36.04901788 | 0.00000000 |
| −127.81216995 | −44.37895226 | 0.00000000 |
| −119.56564139 | −52.14020001 | 0.00000000 |
| −108.37512929 | −59.32883980 | 0.00000000 |
| −94.54631592 | −65.85976094 | 0.00000000 |
| −78.45206004 | −71.58117993 | 0.00000000 |
| −60.50514312 | −76.30572164 | 0.00000000 |
| −41.14123364 | −79.84497755 | 0.00000000 |
| −20.81480821 | −82.03981922 | 0.00000000 |
| 0.00000000 | −82.78388680 | 0.00000000 |
| 20.81480821 | −82.03981922 | 0.00000000 |
| 41.14123364 | −79.84497755 | 0.00000000 |
| 60.50514312 | −76.30572164 | 0.00000000 |
| 78.45206004 | −71.58117993 | 0.00000000 |
| 94.54631592 | −65.85976094 | 0.00000000 |
| 108.37512929 | −59.32883980 | 0.00000000 |
| 119.56564139 | −52.14020001 | 0.00000000 |
| 127.81216995 | −44.37895226 | 0.00000000 |
| 132.90215523 | −36.04901788 | 0.00000000 |
| 134.72873359 | −27.08827008 | 0.00000000 |
| 133.28450320 | −17.41593015 | 0.00000000 |
| 128.64027726 | −7.00096903 | 0.00000000 |
| 120.91931056 | 4.06854295 | 0.00000000 |
| 110.27862576 | 15.53558598 | 0.00000000 |
| 96.90526492 | 26.95859963 | 0.00000000 |
| 81.02923110 | 37.73565917 | 0.00000000 |
| 62.94892446 | 47.16610535 | 0.00000000 |
| 43.05958708 | 54.54074614 | 0.00000000 |
| 21.87104444 | 59.24605219 | 0.00000000 |

TABLE 6 for FIG. 2

| X[mm] | Y[mm] | Z[mm] |
|---|---|---|
| 0.00000000 | 60.86400238 | 0.00000000 |
| −21.87104444 | 59.24605219 | 0.00000000 |
| −43.05958708 | 54.54074614 | 0.00000000 |
| −62.94892446 | 47.16610535 | 0.00000000 |
| −81.02923110 | 37.73565917 | 0.00000000 |
| −96.90526492 | 26.95859963 | 0.00000000 |
| −110.27862576 | 15.53558598 | 0.00000000 |
| −120.91931056 | 4.06854295 | 0.00000000 |
| −128.64027726 | −7.00096903 | 0.00000000 |
| −133.28450320 | −17.41593015 | 0.00000000 |

-continued

Table 6 for FIG. 2

| X[mm] | Y[mm] | Z[mm] |
|---|---|---|
| −134.72873359 | −27.08827008 | 0.00000000 |
| −132.90215523 | −36.04901788 | 0.00000000 |
| −127.81216995 | −44.37895226 | 0.00000000 |
| −119.56564139 | −52.14020001 | 0.00000000 |
| −108.37512929 | −59.32883980 | 0.00000000 |
| −94.54631592 | −65.85976094 | 0.00000000 |
| −78.45206004 | −71.58117993 | 0.00000000 |
| −60.50514312 | −76.30572164 | 0.00000000 |
| −41.14123364 | −79.84497755 | 0.00000000 |
| −20.81480821 | −82.03981922 | 0.00000000 |
| 0.00000000 | −82.78388680 | 0.00000000 |
| 20.81480821 | −82.03981922 | 0.00000000 |
| 41.14123364 | −79.84497755 | 0.00000000 |
| 60.50514312 | −76.30572164 | 0.00000000 |
| 78.45206004 | −71.58117993 | 0.00000000 |
| 94.54631592 | −65.85976094 | 0.00000000 |
| 108.37512929 | −59.32883980 | 0.00000000 |
| 119.56564139 | −52.14020001 | 0.00000000 |
| 127.81216995 | −44.37895226 | 0.00000000 |
| 132.90215523 | −36.04901788 | 0.00000000 |
| 134.72873359 | −27.08827008 | 0.00000000 |
| 133.28450320 | −17.41593015 | 0.00000000 |
| 128.64027726 | −7.00096903 | 0.00000000 |
| 120.91931056 | 4.06854295 | 0.00000000 |
| 110.27862576 | 15.53558598 | 0.00000000 |
| 96.90526492 | 26.95859963 | 0.00000000 |
| 81.02923110 | 37.73565917 | 0.00000000 |
| 62.94892446 | 47.16610535 | 0.00000000 |
| 43.05958708 | 54.54074614 | 0.00000000 |
| 21.87104444 | 59.24605219 | 0.00000000 |

An overall reflectivity of the projection optical unit 7 is 4.19%.

The axes of rotation symmetry of the aspherical mirrors are generally tilted with respect to a normal of the image plane 9, as is made clear by the tilt values in the tables.

The mirrors 22, 23, M1, M3, M4 and M8 have negative values for the radius, i.e. are, in principle, concave mirrors. The mirrors M5, M6 and M7 have positive values for the radius, i.e. are, in principle, convex mirrors. The mirror M2 has a negative value for the radius in the xz-plane and a positive value for the radius in the yz-plane, i.e. it represents a mirror with a toric surface area or a saddle surface.

The image field 8 has an x-extent of 26.0 mm and a y-extent of 1.2 mm. The projection optical unit 7 is optimized for an operating wavelength of the illumination light 3 of 13.5 nm. A field curvature is 0.012578 mm$^{-1}$.

The arrangement plane 17 is perpendicular to the yz-plane and tilted in relation to the xz-plane by an angle α of approximately 32°. This corresponds to the TLA value of the "EP" surface in Table 3b of −57.89°, which was measured proceeding from the xy-plane.

The entry pupil plane 18 is arranged between the mirrors M1 and M2 in the beam path of the imaging light 3. The first pupil plane 18 is tilted relative to the chief ray of a central field point, i.e. it includes an angle 90° with the chief ray. Between the mirrors M1 and M2, the whole beam of the imaging light 3 is accessible from all sides in the region of the pupil plane 18. Therefore, the aperture stop can be arranged in the region of the pupil plane 18. Below, this stop is also denoted by the reference sign 18 and denoted by "AS" in the design data tables.

An edge of a stop surface of the stop 18 emerges from intersection points on the stop surface of all rays of the illumination light 3 which, on the image side, propagate at the field center point in the direction of the stop surface with a complete image-side telecentric aperture. When the stop 18 is embodied as an aperture stop, the edge is an inner edge.

In accordance with the polygon representation of Table 5, the stop 18 can lie in one plane or else have a three-dimensional embodiment. The extent of the stop 18 can be smaller in the scanning direction (y) than in the cross scanning direction (x).

An intermediate image 24 of the projection optical unit 7 is arranged in the imaging beam path in the region of the mirror M5.

A further pupil plane of the projection optical unit 7 is arranged in the region of the reflection of the imaging light 3 at the mirrors M7 and M8. Aperture stops in the region of the mirrors M7 and M8 can be arranged distributed for the x-dimension, on the one hand, and for the y-dimension, on the other hand, at two positions in the imaging beam path, for example there can be an aperture stop for primarily providing a restriction along the y-dimension on the mirror M8 and an aperture stop for primarily providing a restriction along the x-dimension on the mirror M7.

An installation length of the projection optical unit 7 in the z-direction, i.e. a distance between the object plane 5 and the image plane 9, is approximately 2000 mm. A y-distance do's between a central object field point and a central image field point is more than 2000 mm.

The projection optical unit 7 is approximately telecentric on the image side.

Figure 3:
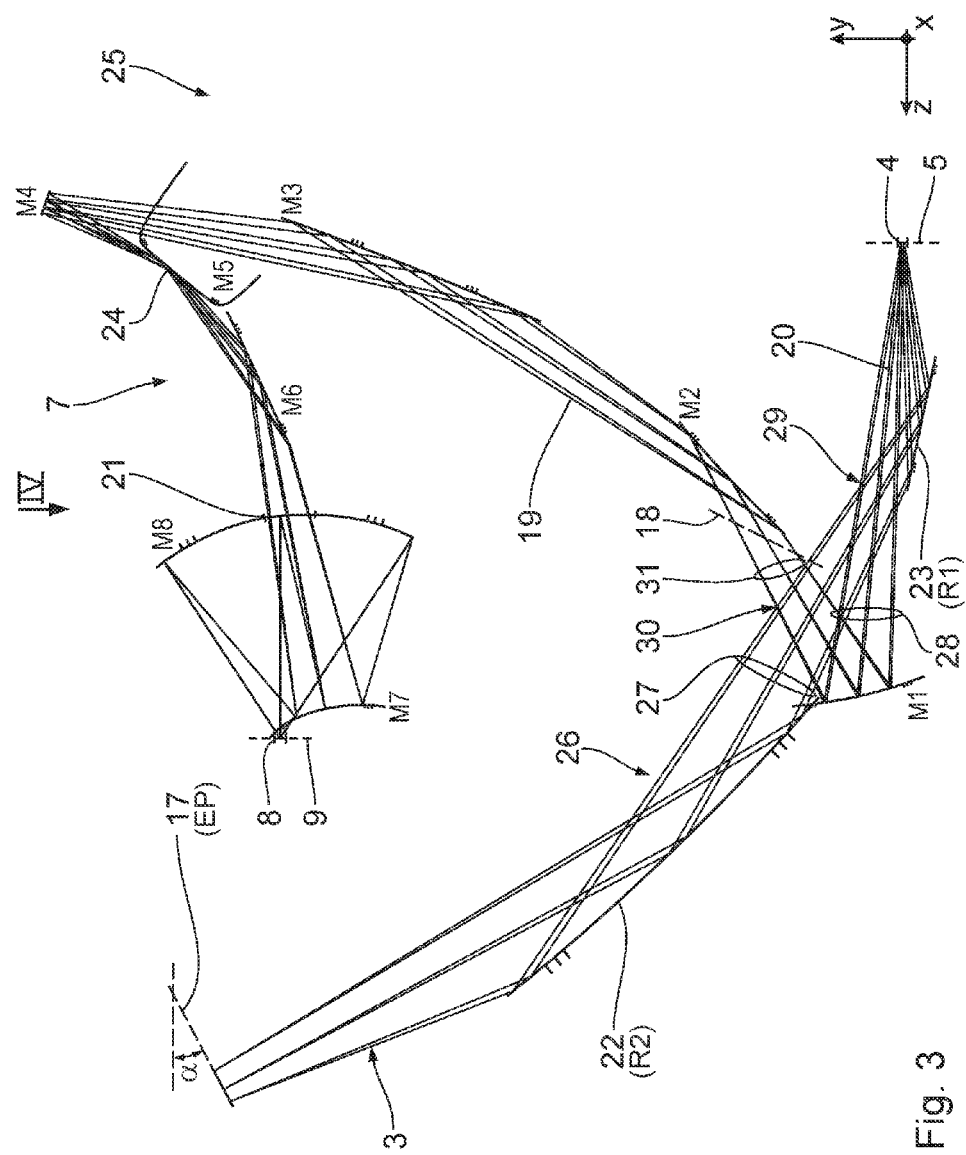
FIG. 3 shows, in an illustration similar to FIG. 2, a further embodiment of an optical subsystem, which is usable in place of the optical subsystem according to FIG. 1.
Figure 4:
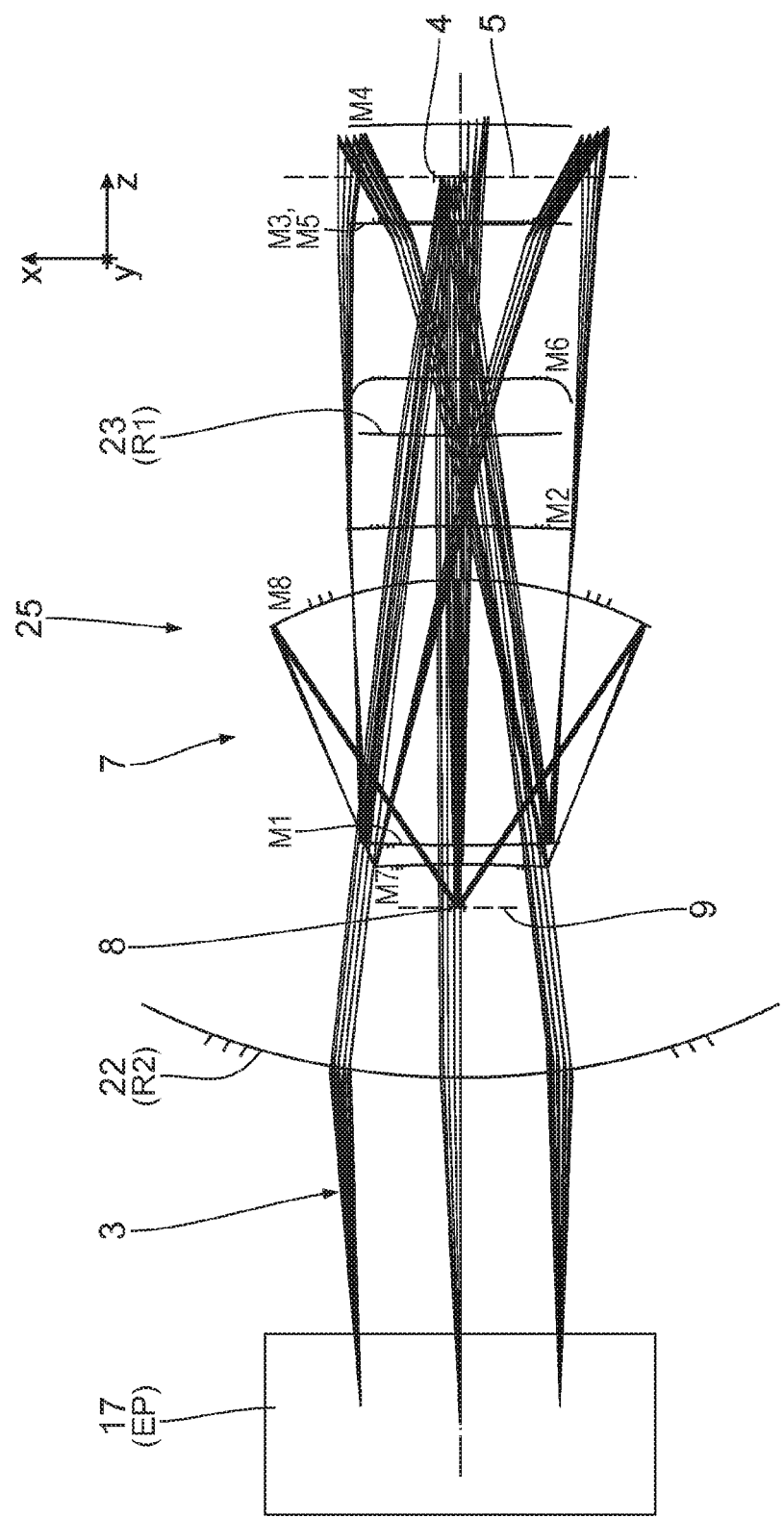
FIG. 4 shows a view of the optical subsystem according to FIG. 3, as seen from the viewing direction IV in FIG. 3.

A further embodiment of an optical subsystem 25, which can be used in the projection exposure apparatus 1 according to FIG. 1 in place of the optical subsystem 15, is explained below on the basis of FIGS. 3 and 4. Components and functions which were already explained above in the context of FIGS. 1 and 2 optionally have the same reference signs and are not once again discussed in detail. FIG. 3 shows a meridional section through the optical subsystem 25. FIG. 4 shows a sagittal view of the optical subsystem 25. In addition to the projection optical unit 7, which is unchanged in relation to the projection optical unit 7 according to FIG. 2, the optical subsystem 25 contains a variant of an imaging optical subunit 26, which images the arrangement plane 19 lying upstream of the object field 4 in the beam path of the imaging light 3 into the entry pupil plane 18.

The imaging optical subunit 26 also has two GI mirrors 22, 23, which are also denoted as R2 and R1 below.

Compared to the orientation of deflecting effects of the mirrors of the projection optical unit, a deflecting effect of the mirrors 22, 23 of the imaging optical subunit 26 is oriented precisely in the opposite direction to the deflecting effect in the case of the optical subunit 16.

In the optical subunit 26, the GI mirrors 22, 23 are also configured as a pair of mirrors deflecting the illumination light 3 in the same sense. In the illustration according to FIG. 3, the GI mirrors 22, 23 both deflect the illumination light in an anticlockwise direction. Folding planes of the GI mirrors 22, 23 of the imaging optical subunit 26 once again lie in the yz-plane.

A first, illumination-side imaging light partial beam 27 is present in the beam path upstream of the last mirror 23 in the beam path upstream of the object field 4. This first, illumination-side imaging light partial beam 27 lies between the two GI mirrors 22, 23 of the imaging optical subunit 26. A further, imaging-side imaging light partial beam 28 is present between the object field 4 and the first mirror M1 of the projection optical unit 7 in the beam path downstream of the object field 4. The two imaging light partial beams 27 and 28 cross in a crossing region 29.

Spatially, the imaging-side imaging light partial beam 28 lies between the GI mirror 23 and the mirror M2.

The imaging light partial beam 27 crosses with a further imaging light partial beam 31 in a further crossing region 30 between the mirrors M1 and M2 of the projection optical unit 7.

Coupling in the illumination light 3 via the crossing region 29 and the last GI mirror 23 upstream of the object field 4 leads to the possibility of creating a relatively large distance (free board) between a reflection used region on the GI mirror 23 and the imaging light partial beam 28 passing thereby. In FIG. 3, this distance is denoted by FB.

The arrangement plane 17 is perpendicular to the yz-plane and tilted in relation to the xz-plane by an angle α of approximately 27.9°. This corresponds to the TLA value of the "EP" surface in Table 3b for FIGS. 3 and 4 of 62.1°, which was measured proceeding from the xy-plane.

The mirrors 22 (R2), 23 (R1) and M1 to M8 of the optical subsystem 25 are once again configured as free-form surface mirrors, to which the free-form surface equation (1), specified above, applies. The optical design data of the optical subsystem 25 can accordingly be gathered from the following tables, which, in terms of the structure thereof, correspond to the tables for the optical subsystem 15 according to FIG. 2. Since the data of the mirrors M1 to M8 of the projection optical unit 7 in the optical subsystem 25 are identical to these data of the mirrors M1 to M8 of the optical subsystem 15 according to FIG. 2, which were already put into a table above, the data in relation to mirrors M1 to M8 have been omitted below.

Table 5 has been omitted since the positioning and the edge contour of the aperture stop in the embodiment according to FIGS. 3/4 are identical to those in the embodiment according to FIG. 2. The subsequent table, which describes the polygonal chain of the beam-delimiting edge contour of the pupil EP in the arrangement plane 17, is still denoted as Table 6 in accordance with the tabulation of the design data in relation to the embodiment according to FIG. 2.

The GI mirror 23 (R1) has a negative value for the radius in the xz-plane and a positive value for the radius in the yz-plane, i.e. it has a toric basic shape or a basic shape in the style of a saddle surface. The further GI mirror 22 (R2) has negative values for the radius in both planes, i.e. it is, in principle, a concave mirror. The $R_y$ values for the radius of both GI mirrors 22, 23 are large in terms of the absolute values thereof, and so the GI mirrors 22, 23 have approximately planar reflection surfaces in the xz-plane.

Table 1 for FIGS. 3/4

| Surface | Radius_x[mm] | Power_x[1/mm] | Radius_y[mm] | Power_y[1/mm] | Operating mode |
|---|---|---|---|---|---|
| R1 | −1647.3319728 | 0.0003752 | 29234.0114589 | −0.0002214 | REFL |
| R2 | −1432.2897164 | 0.0003849 | −10221.5972337 | 0.0007099 | REFL |

Table 2 for FIGS. 3/4

| Coefficient | R1 | R2 |
|---|---|---|
| KY | 0.00000000 | 0.00000000 |
| KX | 0.00000000 | 0.00000000 |
| RX | −1647.33197300 | −1432.28971600 |
| C7 | 1.15012945e−07 | 4.73688125e−08 |
| C9 | 1.54084479e−08 | 2.80308388e−09 |
| C10 | −2.45708461e−11 | 1.78200552e−11 |
| C12 | 1.05165435e−10 | −2.71844186e−11 |
| C14 | −7.21907913e−13 | −4.0195376e−12 |

Table 3a for FIGS. 3/4

| Surface | DCX | DCY | DCZ |
|---|---|---|---|
| R1 | 0.00000000 | −2546.30347262 | 1272.00096574 |
| R2 | −0.00000000 | −1543.03388938 | −458.15802792 |
| EP | −0.00000000 | 224.63155154 | −1393.76418917 |

Table 3b for FIGS. 3/4

| Surface | TLA[deg] | TLB[deg] | TLC[deg] |
|---|---|---|---|
| R1 | −77.89178399 | 180.00000000 | −0.00000000 |
| R2 | 136.10821601 | 0.00000000 | −0.00000000 |
| EP | 62.10821601 | 180.00000000 | −0.00000000 |

Table 4 for FIGS. 3/4

| Surface | AOI[deg] | Reflectivity |
|---|---|---|
| R1 | 72.00000000 | 0.74756124 |
| R2 | 74.00000000 | 0.78628908 |
| Overall transmission | | 0.0353 |

Table 6 for FIGS. 3/4

| X[mm] | Y[mm] | Z[mm] |
|---|---|---|
| 0.00000000 | 82.12364914 | 0.00000000 |
| −42.39404327 | 81.90547687 | 0.00000000 |
| −83.70570586 | 81.27203369 | 0.00000000 |
| −122.88096926 | 80.27285660 | 0.00000000 |
| −158.92177914 | 78.94919704 | 0.00000000 |
| −190.91392604 | 77.28721454 | 0.00000000 |
| −218.05674249 | 75.17869236 | 0.00000000 |
| −239.69346217 | 72.40404561 | 0.00000000 |
| −255.33729472 | 68.64421501 | 0.00000000 |
| −264.68604697 | 63.52027707 | 0.00000000 |
| −267.61897957 | 56.65754341 | 0.00000000 |
| −264.17435930 | 47.76876424 | 0.00000000 |
| −254.51339394 | 36.74460250 | 0.00000000 |

-continued

Table 6 for FIGS. 3/4

| X[mm] | Y[mm] | Z[mm] |
|---|---|---|
| −238.88269936 | 23.73404640 | 0.00000000 |
| −217.58952309 | 9.19546237 | 0.00000000 |
| −191.00056642 | −6.09727921 | 0.00000000 |
| −159.56772515 | −21.10167702 | 0.00000000 |
| −123.87497486 | −34.60647908 | 0.00000000 |
| −84.69109669 | −45.37813563 | 0.00000000 |
| −43.00285281 | −52.33886287 | 0.00000000 |

-continued

Table 6 for FIGS. 3/4

| X[mm] | Y[mm] | Z[mm] |
|---|---|---|
| 0.00000000 | −54.74738713 | 0.00000000 |
| 43.00285281 | −52.33886287 | 0.00000000 |
| 84.69109669 | −45.37813563 | 0.00000000 |
| 123.87497486 | −34.60647908 | 0.00000000 |
| 159.56772515 | −21.10167702 | 0.00000000 |
| 191.00056642 | −6.09727921 | 0.00000000 |
| 217.58952309 | 9.19546237 | 0.00000000 |
| 238.88269936 | 23.73404640 | 0.00000000 |
| 254.51339394 | 36.74460250 | 0.00000000 |
| 264.17435930 | 47.76876424 | 0.00000000 |
| 267.61897957 | 56.65754341 | 0.00000000 |
| 264.68604697 | 63.52027707 | 0.00000000 |
| 255.33729472 | 68.64421501 | 0.00000000 |
| 239.69346217 | 72.40404561 | 0.00000000 |
| 218.05674249 | 75.17869236 | 0.00000000 |
| 190.91392604 | 77.28721454 | 0.00000000 |
| 158.92177914 | 78.94919704 | 0.00000000 |
| 122.88096926 | 80.27285660 | 0.00000000 |
| 83.70570586 | 81.27203369 | 0.00000000 |
| 42.39404327 | 81.90547687 | 0.00000000 |

An overall reflectivity of the optical subsystem 25 is 3.53%.

Figure 5:
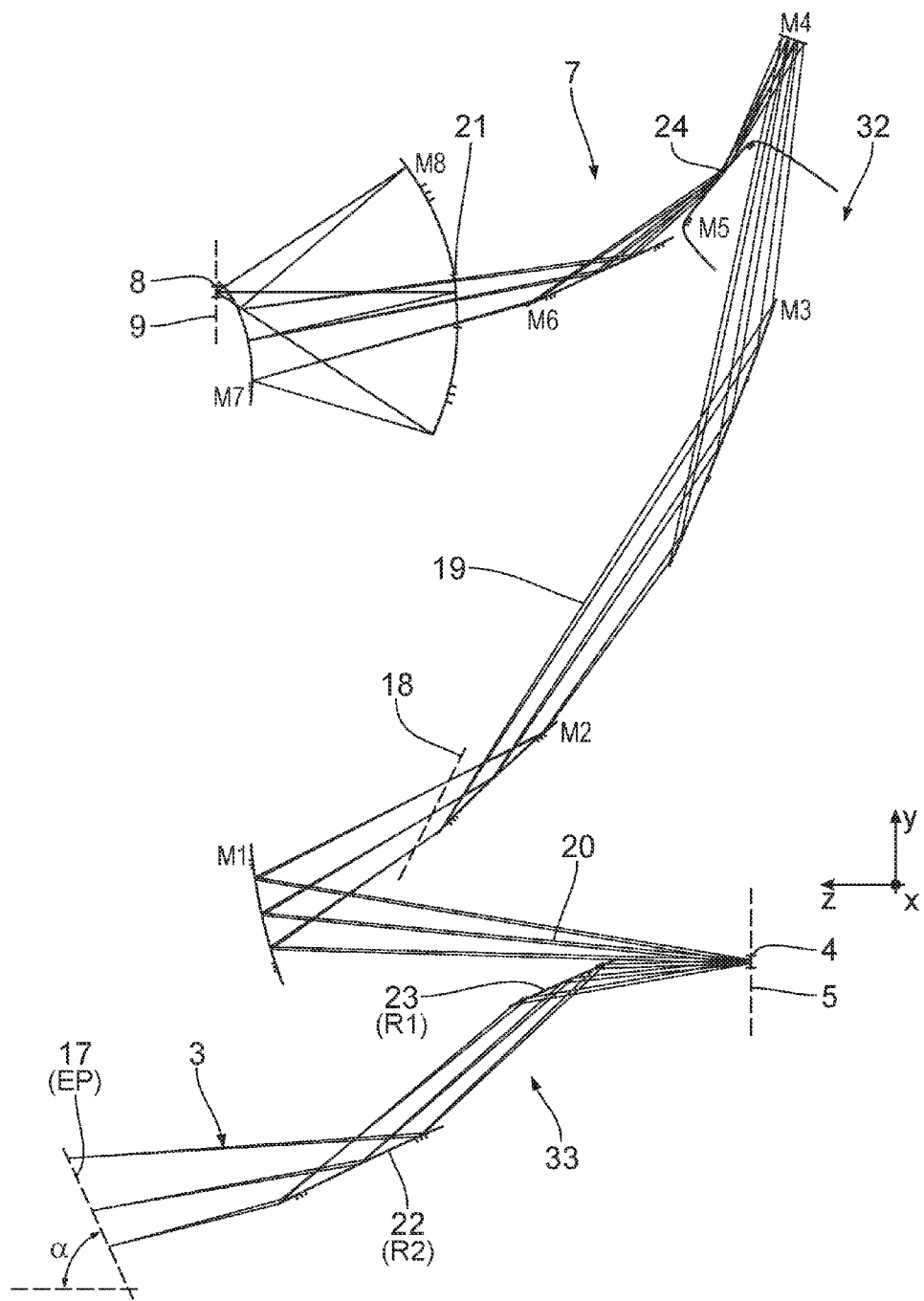
Figure 6:
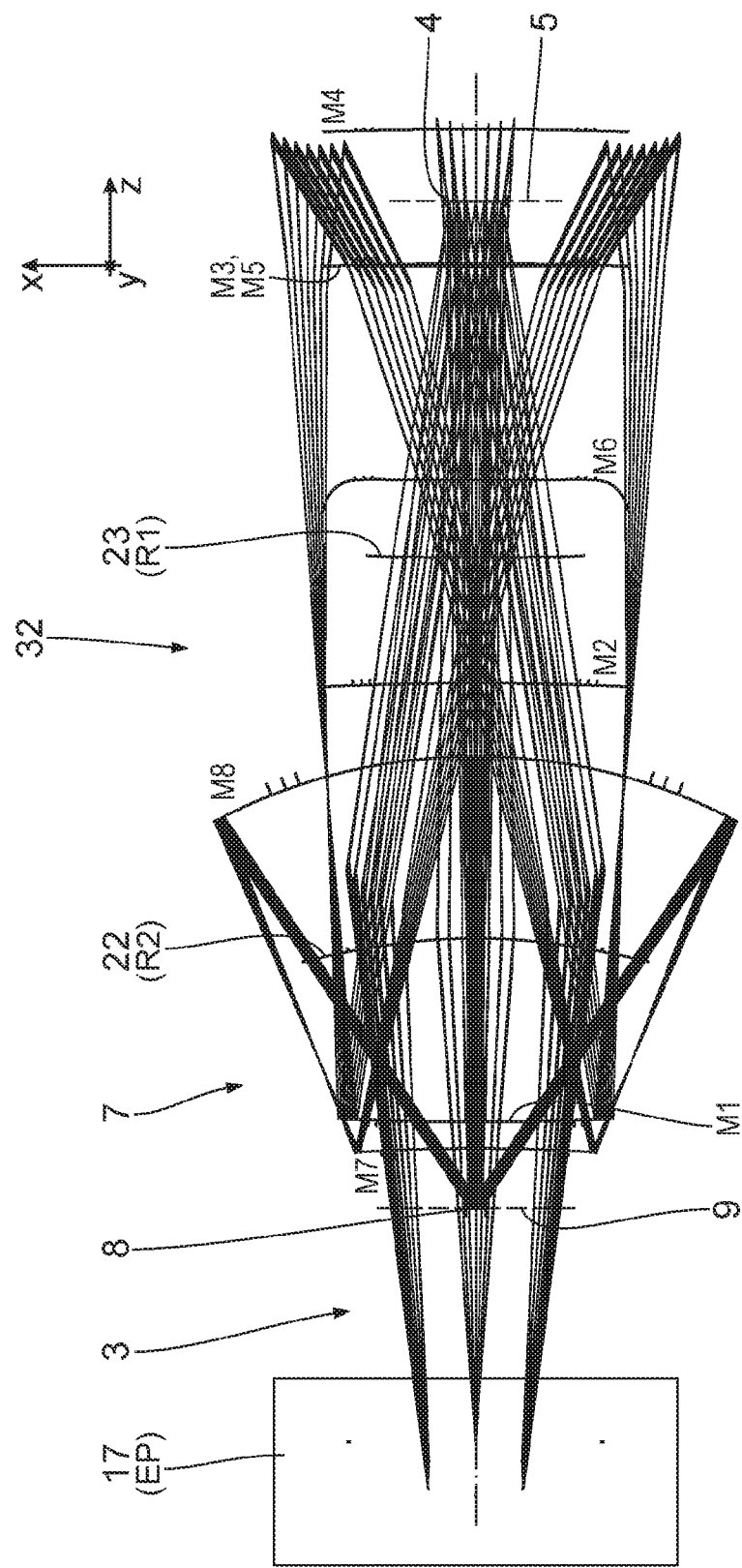

A further embodiment of an optical subsystem 32, which can be used in the projection exposure apparatus 1 according to FIG. 1 in place of the optical subsystem 15, is explained below on the basis of FIGS. 5 and 6. Components and functions which were already explained above in the context of FIGS. 1 and 2 optionally have the same reference signs and are not once again discussed in detail. FIG. 5 shows a meridional section through the optical subsystem 32. FIG. 6 shows a sagittal view of the optical subsystem 32. In addition to the projection optical unit 7, the optical subsystem 32 contains a variant of an imaging optical subunit 33, which images the arrangement plane 17 lying upstream of the object field 4 in the beam path of the imaging light 3 into the entry pupil plane 18.

The imaging optical subunit 33 also has two GI mirrors 22, 23, which are also denoted as R2 and R1 below.

The mirrors 22 (R2), 23 (R1) and M1 to M8 of the optical subsystem 32 are once again configured as free-form surface mirrors, to which the free-form surface equation (1), specified above, applies. The optical design data of the optical subsystem 32 can accordingly be gathered from the following tables, which, in terms of the structure thereof, correspond to the tables for the optical subsystem 15 according to FIG. 2. Since the data of the mirrors M1 to M8 of the projection optical unit 7 in the optical subsystem 32 are identical to these data of the mirrors M1 to M8 of the optical subsystem 15 according to FIG. 2, which were already put into a table above, the data in relation to mirrors M1 to M8 have been omitted below.

Table 5 has been omitted since the positioning and the edge contour of the aperture stop in the embodiment according to FIGS. 5/6 are identical to those in the embodiment according to FIG. 2.

Table 1 for FIGS. 5/6

| Surface | Radius_x[mm] | Power_x[1/mm] | Radius_y[mm] | Power_y[1/mm] | Operating mode |
|---|---|---|---|---|---|
| R1 | −53909.1399450 | 0.0000115 | −9263.7910409 | 0.0006986 | REFL |
| R2 | −458.8171635 | 0.0012015 | 13829.3040346 | −0.0005247 | REFL |

Table 2 for FIGS. 5/6

| Coefficient | R1 | R2 |
|---|---|---|
| KY | 0.00000000 | 0.00000000 |
| KX | 0.00000000 | 0.00000000 |
| RX | −53909.13995000 | −458.81716350 |
| C7 | −7.45510762e−07 | 5.65832667e−07 |
| C9 | −7.8174184e−08 | 1.82754455e−07 |
| C10 | −9.81683422e−09 | 2.90061882e−09 |
| C12 | 1.01545647e−09 | −5.45747402e−10 |
| C14 | −2.50276712e−10 | 8.9058981e−11 |
| C16 | 1.0516081e−11 | 5.30630477e−12 |
| C18 | 5.06846087e−12 | −6.02347856e−13 |
| C20 | 1.04928376e−12 | −8.41527425e−13 |
| C21 | 2.50981125e−13 | 6.15659956e−15 |
| C23 | −1.26450389e−14 | −6.35582907e−15 |
| C25 | −8.11830834e−15 | 4.98756661e−15 |
| C27 | 3.88924097e−15 | −5.40926967e−16 |
| C29 | −2.75693831e−16 | −5.98616547e−17 |
| C31 | −7.77059012e−17 | −6.01249257e−17 |
| C33 | −6.09748058e−17 | −9.39730555e−19 |
| C35 | −5.90051055e−18 | 5.70967053e−19 |
| C36 | −3.02770829e−18 | −2.64153877e−20 |
| C38 | −7.38146964e−19 | 2.53674164e−19 |
| C40 | −3.2497283e−21 | 5.90924901e−20 |
| C42 | −2.85220735e−20 | 1.61003857e−20 |
| C44 | −2.29704682e−20 | 3.15946526e−21 |

Table 3a for FIGS. 5/6

| Surface | DCX | DCY | DCZ |
|---|---|---|---|
| R1 | 0.00000000 | −2546.30347262 | 1272.00096574 |
| R2 | 0.00000000 | −3214.02928961 | 527.59366237 |
| EP | 0.00000000 | −3385.81712698 | −457.54030768 |

Table 3b for FIGS. 5/6

| Surface | TLA[deg] | TLB[deg] | TLC[deg] |
|---|---|---|---|
| R1 | 66.10821601 | 180.00000000 | −0.00000000 |
| R2 | 64.10821601 | 0.00000000 | 0.00000000 |
| EP | −24.89178399 | 180.00000000 | −0.00000000 |

Table 4 for FIGS. 5/6

| Surface | AOI[deg] | Reflectivity |
|---|---|---|
| R1 | 72.00000000 | 0.74756124 |
| R2 | 74.00000000 | 0.78628908 |
| Overall transmission | | 0.0353 |

Table 6 for FIGS. 5/6

| X[mm] | Y[mm] | Z[mm] |
|---|---|---|
| 0.00000000 | 212.96044398 | 0.00000000 |
| −4.00933149 | 214.47606638 | 0.00000000 |
| −8.82954329 | 218.57920215 | 0.00000000 |
| −15.11166492 | 224.03736840 | 0.00000000 |
| −23.23234208 | 229.08127943 | 0.00000000 |
| −33.24663174 | 231.71720779 | 0.00000000 |
| −44.89427972 | 230.04113731 | 0.00000000 |
| −57.61328051 | 222.56120909 | 0.00000000 |
| −70.52756522 | 208.52110220 | 0.00000000 |
| −82.46059896 | 188.10946335 | 0.00000000 |
| −92.11107544 | 162.37275926 | 0.00000000 |
| −98.45235948 | 132.75461407 | 0.00000000 |
| −101.12677642 | 100.47456687 | 0.00000000 |
| −100.43181028 | 66.20316519 | 0.00000000 |
| −96.87080504 | 30.26720832 | 0.00000000 |
| −90.70754678 | −6.90395289 | 0.00000000 |
| −81.74827244 | −44.43882329 | 0.00000000 |
| −69.21978919 | −80.76288731 | 0.00000000 |
| −51.79422090 | −113.15953808 | 0.00000000 |
| −28.31870891 | −136.98072937 | 0.00000000 |
| 0.00000000 | −146.02429559 | 0.00000000 |
| 28.31870891 | −136.98072937 | 0.00000000 |
| 51.79422090 | −113.15953808 | 0.00000000 |
| 69.21978919 | −80.76288731 | 0.00000000 |
| 81.74827244 | −44.43882329 | 0.00000000 |
| 90.70754678 | −6.90395289 | 0.00000000 |
| 96.87080504 | 30.26720832 | 0.00000000 |
| 100.43181028 | 66.20316519 | 0.00000000 |
| 101.12677642 | 100.47456687 | 0.00000000 |
| 98.45235948 | 132.75461407 | 0.00000000 |
| 92.11107544 | 162.37275926 | 0.00000000 |
| 82.46059896 | 188.10946335 | 0.00000000 |
| 70.52756522 | 208.52110220 | 0.00000000 |
| 57.61328051 | 222.56120909 | 0.00000000 |
| 44.89427972 | 230.04113731 | 0.00000000 |
| 33.24663174 | 231.71720779 | 0.00000000 |
| 23.23234208 | 229.08127943 | 0.00000000 |
| 15.11166492 | 224.03736840 | 0.00000000 |
| 8.82954329 | 218.57920215 | 0.00000000 |
| 4.00933149 | 214.47606638 | 0.00000000 |

An overall reflectivity of the optical subsystem 32 is 3.53%.

The imaging optical subunit 33 once again has two GI mirrors 22 (R2) and 23 (R1). In the meridional section according to FIG. 5, the first GI mirror 22 deflects in an anticlockwise manner in the beam path of the illumination light 3 and the second GI mirror 23 (R1) deflects in a clockwise manner. Thus, the two GI mirrors 22, 23 have effects deflecting in the opposite sense. Folding planes of the GI mirrors 22, 23 of the imaging optical subunit 33 once again lie in the yz-plane.

The arrangement plane 17 is perpendicular to the yz-plane and tilted in relation to the xz-plane by an angle α of approximately 65.1°. This corresponds to the TLA value of the "EP" surface in Table 3b for FIGS. 5 and 6 of −24.89°, which was measured proceeding from the xy-plane.

The GI mirror 23 (R1) has negative values for the radius, i.e. it is, in principle, a concave mirror. The GI mirror 22 (R2) has values for the radius with different signs, i.e. it has a basic form of a toric surface or a saddle surface. The mirror 23 (R1) has, in absolute terms, very large values for the radius, i.e. it is approximately a planar mirror. This applies correspondingly to the value $R_y$ of the radius of the mirror 22 (R2).

Figure 7:
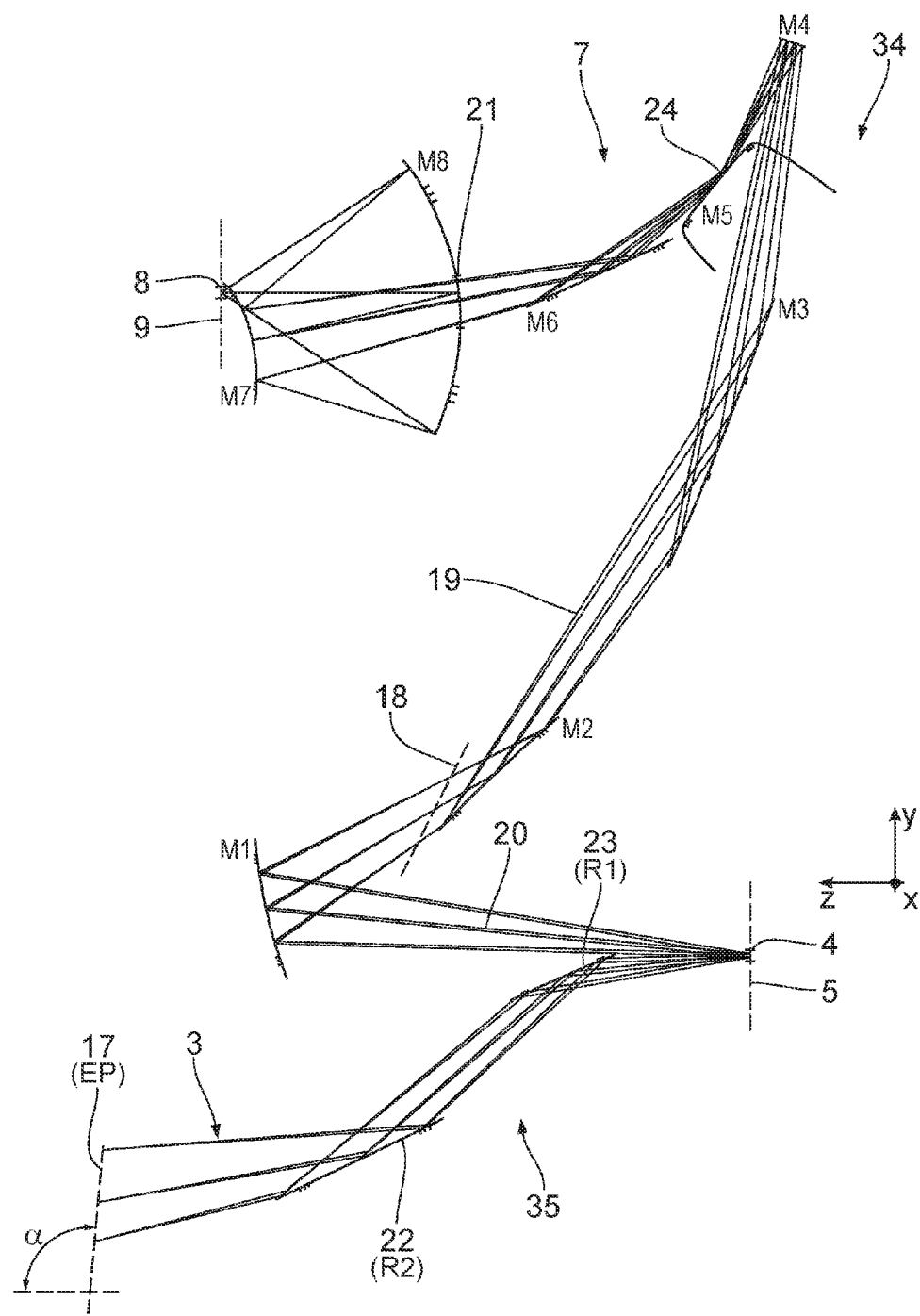
Figure 8:
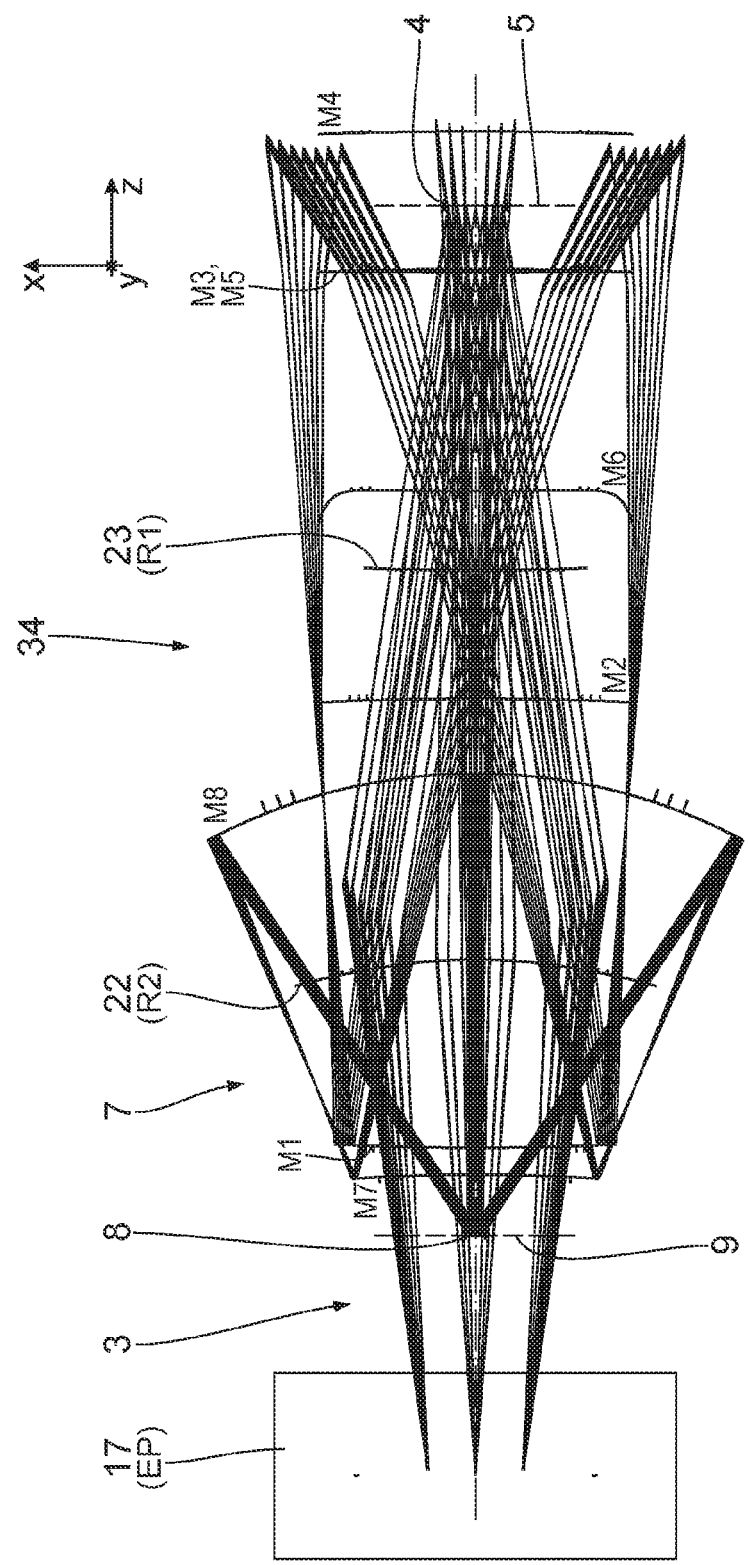

A further embodiment of an optical subsystem 34, which can be used in the projection exposure apparatus 1 according to FIG. 1 in place of the optical subsystem 15, is explained below on the basis of FIGS. 7 and 8. Components and functions which were already explained above in the context of FIGS. 1 and 2 optionally have the same reference signs and are not once again discussed in detail. FIG. 7 shows a meridional section through the optical subsystem 34. FIG. 8 shows a sagittal view of the optical subsystem 34. In addition to the projection optical unit 7, the optical subsystem 34 contains a variant of an imaging optical subunit 35, which images the arrangement plane 17 lying upstream of the object field 4 in the beam path of the imaging light 3 into the entry pupil plane 18.

The imaging optical subunit 35 also has two GI mirrors 22, 23, which are also denoted as R2 and R1 below.

Folding planes of the GI mirrors 22, 23 of the imaging optical subunit 35 once again lie in the yz-plane.

The mirrors 22 (R2), 23 (R1) and M1 to M8 of the optical subsystem 34 are once again configured as free-form surface mirrors, to which the free-form surface equation (1), specified above, applies. The optical design data of the optical subsystem 34 can accordingly be gathered from the following tables, which, in terms of the structure thereof, correspond to the tables for the optical subsystem 15 according to FIG. 2. Since the data of the mirrors M1 to M8 of the projection optical unit 7 in the optical subsystem 34 are identical to these data of the mirrors M1 to M8 of the optical subsystem 15 according to FIG. 2, which were already put into a table above, the data in relation to mirrors M1 to M8 have been omitted below.

Table 5 has been omitted since the positioning and the edge contour of the aperture stop in the embodiment according to FIGS. 3/4 are identical to those in the embodiment according to FIG. 2.

In principle, the imaging optical subunit 35 according to FIGS. 7 and 8 corresponds to the imaging optical subunit 33 according to FIGS. 5 and 6. A difference lies in the location of the arrangement plane 17 and, in particular, the tilt thereof, for example in relation to the xz-plane.

The associated tilt angle α is 95.1°, corresponding to a TLA value of the arrangement plane 17 (EP) of 5.108° in Table 3b for FIGS. 7/8.

Table 1 for FIGS. 7/8

| Surface | Radius_x[mm] | Power_x[1/mm] | Radius_y[mm] | Power_y[1/mm] | Operating mode |
|---|---|---|---|---|---|
| R1 | −26828.7909274 | 0.0000230 | −9640.3904371 | 0.0006714 | REFL |
| R2 | −462.7288275 | 0.0011914 | 16206.7233500 | −0.0004477 | REFL |

Table 2 for FIGS. 7/8

| Coefficient | R1 | R2 |
|---|---|---|
| KY | 0.00000000 | 0.00000000 |
| KX | 0.00000000 | 0.00000000 |
| RX | −26828.79093000 | −462.72882750 |
| C7 | −6.47379803e-07 | 4.02868952e-07 |
| C9 | −8.01899251e-08 | 1.70263561e-07 |
| C10 | −8.52973241e-09 | 2.14983864e-09 |
| C12 | 6.90568892e-10 | −5.40877795e-10 |
| C14 | −2.68242886e-10 | 9.60513448e-11 |
| C16 | 6.05988157e-12 | 6.13023115e-12 |
| C18 | 5.4718542e-13 | −2.72299907e-13 |
| C20 | 1.04029647e-12 | −7.56204446e-13 |
| C21 | 2.05800845e-13 | 7.91570138e-15 |
| C23 | −5.7453685e-15 | −3.76960152e-15 |
| C25 | −2.94199596e-15 | 4.87911576e-15 |
| C27 | 3.96865264e-15 | −6.64820247e-16 |
| C29 | −1.94766675e-16 | −6.31041619e-17 |
| C31 | −8.83090075e-17 | −6.62425818e-17 |
| C33 | −6.40200785e-17 | −2.08141153e-18 |
| C35 | −5.7788035e-18 | 5.50795181e-19 |
| C36 | −2.42041806e-18 | −2.64561455e-20 |
| C38 | −6.81182337e-19 | 2.46023563e-19 |
| C40 | −1.06265144e-19 | 6.17407297e-20 |
| C42 | −7.23343428e-20 | 1.60452591e-20 |
| C44 | −2.26448099e-20 | 3.21609068e-21 |

Table 3a for FIGS. 7/8

| Surface | DCX | DCY | DCZ |
|---|---|---|---|
| R1 | 0.00000000 | −2546.30347262 | 1272.00096574 |
| R2 | 0.00000000 | −3214.02928961 | 527.59366237 |
| EP | 0.00000000 | −3385.81712698 | −457.54030768 |

Table 3b for FIGS. 7/8

| Surface | TLA[deg] | TLB[deg] | TLC[deg] |
|---|---|---|---|
| R1 | 66.10821601 | 180.00000000 | −0.00000000 |
| R2 | 64.10821601 | 0.00000000 | 0.00000000 |
| EP | 5.10821601 | 180.00000000 | −0.00000000 |

Table 4 for FIGS. 7/8

| Surface | AOI[deg] | Reflectivity |
|---|---|---|
| R1 | 72.00000000 | 0.74756124 |
| R2 | 74.00000000 | 0.78628908 |
| Overall transmission | | 0.0353 |

Table 6 for FIGS. 7/8

| X[mm] | Y[mm] | Z[mm] |
|---|---|---|
| 0.00000000 | 195.16615681 | 0.00000000 |
| −5.20873081 | 196.35071605 | 0.00000000 |
| −11.05000040 | 199.55273759 | 0.00000000 |
| −18.01958857 | 203.78592994 | 0.00000000 |
| −26.39025738 | 207.61088649 | 0.00000000 |
| −36.19058461 | 209.37392731 | 0.00000000 |
| −47.22081667 | 207.46143615 | 0.00000000 |
| −59.05591880 | 200.56466734 | 0.00000000 |
| −71.01028026 | 187.94097174 | 0.00000000 |
| −82.11551803 | 169.58962680 | 0.00000000 |
| −91.23481202 | 146.21828682 | 0.00000000 |
| −97.38433612 | 118.93600323 | 0.00000000 |
| −100.09805940 | 88.78736032 | 0.00000000 |
| −99.49391154 | 56.44023263 | 0.00000000 |
| −95.94483322 | 22.26756214 | 0.00000000 |
| −89.66321019 | −13.29044539 | 0.00000000 |
| −80.44706100 | −49.34148842 | 0.00000000 |
| −67.58776186 | −84.21860665 | 0.00000000 |
| −50.02106452 | −115.13839368 | 0.00000000 |
| −27.05444127 | −137.67134146 | 0.00000000 |
| 0.00000000 | −146.17118635 | 0.00000000 |
| 27.05444127 | −137.67134146 | 0.00000000 |
| 50.02106452 | −115.13839368 | 0.00000000 |
| 67.58776186 | −84.21860665 | 0.00000000 |
| 80.44706100 | −49.34148842 | 0.00000000 |
| 89.66321019 | −13.29044539 | 0.00000000 |
| 95.94483322 | 22.26756214 | 0.00000000 |
| 99.49391154 | 56.44023263 | 0.00000000 |
| 100.09805940 | 88.78736032 | 0.00000000 |
| 97.38433612 | 118.93600323 | 0.00000000 |
| 91.23481202 | 146.21828682 | 0.00000000 |
| 82.11551803 | 169.58962680 | 0.00000000 |
| 71.01028026 | 187.94097174 | 0.00000000 |
| 59.05591880 | 200.56466734 | 0.00000000 |
| 47.22081667 | 207.46143615 | 0.00000000 |
| 36.19058461 | 209.37392731 | 0.00000000 |
| 26.39025738 | 207.61088649 | 0.00000000 |
| 18.01958857 | 203.78592994 | 0.00000000 |
| 11.05000040 | 199.55273759 | 0.00000000 |
| 5.20873081 | 196.35071605 | 0.00000000 |

An overall reflectivity of the optical subsystem 34 is 3.53%.

By way of the respective tilt of the arrangement plane 17, it is possible to take account of desired installation space properties, in particular of a pupil facet mirror which is intended to be housed there.

Figure 9:
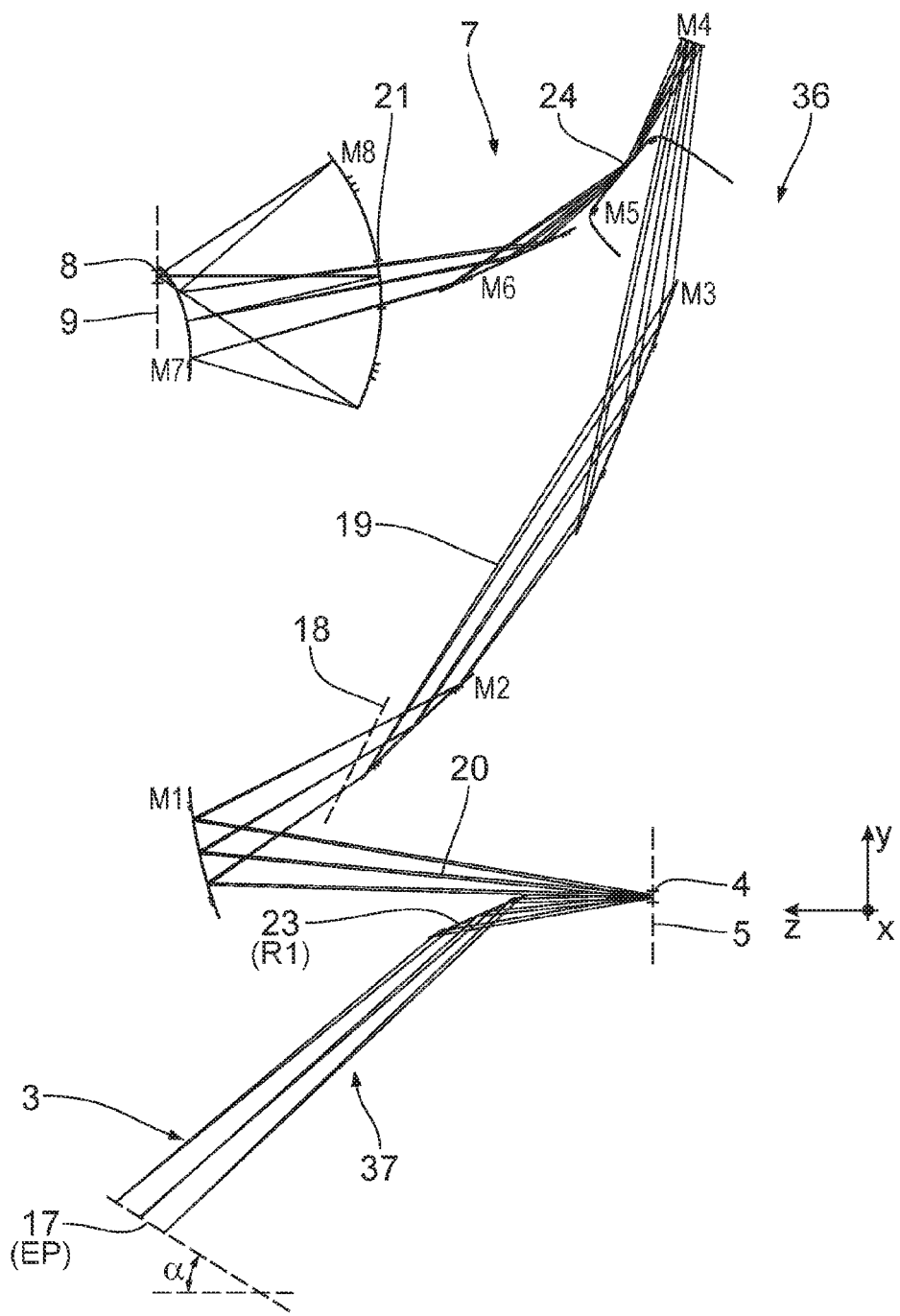

A further embodiment of an optical subsystem 36, which can be used in the projection exposure apparatus 1 according to FIG. 1 in place of the optical subsystem 15, is explained below on the basis of FIGS. 9 and 10. Components and functions which were already explained above in the context of FIGS. 1 and 2 optionally have the same reference signs and are not once again discussed in detail. FIG. 9 shows a meridional section through the optical subsystem 36. FIG. 10 shows a sagittal view of the optical subsystem 36. In addition to the projection optical unit 7, the optical subsystem 36 contains a variant of an imaging optical subunit 37, which images the arrangement plane 17 lying upstream of the object field 4 in the beam path of the imaging light 3 into the entry pupil plane 18.

A folding plane of the GI mirror 23 of the imaging optical subunit 37 once again lies in the yz-plane.

The mirrors 23 (R1) and M1 to M8 of the optical subsystem 36 are once again configured as free-form surface mirrors, to which the free-form surface equation (1), specified above, applies. The optical design data of the optical subsystem 36 can accordingly be gathered from the following tables, which, in terms of the structure thereof, correspond to the tables for the optical subsystem 15 according to FIG. 2. Since the data of the mirrors M1 to M8 of the projection optical unit 7 in the optical subsystem 36 are identical to these data of the mirrors M1 to M8 of the optical subsystem 15 according to FIG. 2, which were already put into a table above, the data in relation to mirrors M1 to M8 have been omitted below.

Table 5 has been omitted since the positioning and the edge contour of the aperture stop in the embodiment according to FIGS. 7/8 are identical to those in the embodiment according to FIG. 2.

The imaging optical subunit 37 of the embodiments according to FIGS. 9 and 10 has precisely one GI mirror, namely the GI mirror 23 (R1). Together with the mirror M1 of the projection optical unit 7, this GI mirror 23 images the arrangement plane 17 into the entry pupil plane 18. The GI mirror 23 of the imaging optical subunit 37 is once again part of the illumination optical unit 6.

Table 1 for FIGS. 9/10

| Surface | Radius_x [mm] | Power_x [1/mm] | Radius_y [mm] | Power_y [1/mm] | Operating mode |
|---|---|---|---|---|---|
| R1 | −722.7146652 | 0.0008552 | −9309.0147398 | 0.0006953 | REFL |

Table 2 for FIGS. 9/10

| Coefficient | R1 |
|---|---|
| KY | 0.00000000 |
| KX | 0.00000000 |
| RX | −722.71466520 |
| C7 | −1.83397908e−07 |
| C9 | −1.88234497e−07 |
| C10 | 3.55703915e−09 |
| C12 | 2.03980855e−09 |
| C14 | −3.36454918e−10 |
| C16 | 1.82772737e−11 |
| C18 | 1.80631197e−11 |
| C20 | 1.21277706e−11 |
| C21 | −4.27577512e−13 |
| C23 | −3.30632389e−13 |
| C25 | −1.23592191e−13 |
| C27 | 3.44355285e−14 |
| C29 | −1.65585763e−15 |
| C31 | −1.32949496e−15 |
| C33 | −9.07085299e−16 |
| C35 | −4.90548076e−16 |
| C36 | 2.58691773e−17 |
| C38 | 2.21674441e−17 |
| C40 | 1.5494506e−17 |
| C42 | 4.12390251e−18 |
| C44 | −1.65514093e−18 |
| C46 | 7.6864918e−20 |
| C48 | 7.02243733e−20 |
| C50 | 3.71431085e−20 |
| C52 | 2.3060754e−20 |
| C54 | 1.03787394e−20 |
| C55 | −8.34258157e−22 |
| C57 | −7.85819376e−22 |
| C59 | −5.41427279e−22 |
| C61 | −4.07551716e−22 |
| C63 | −5.81608728e−23 |
| C65 | 3.82259433e−23 |
| C67 | −1.35941026e−24 |
| C69 | −1.553163e−24 |
| C71 | −7.75500817e−25 |
| C73 | −4.38081168e−25 |
| C75 | −2.21787324e−25 |
| C77 | −8.80082775e−26 |
| C78 | 1.09725771e−26 |
| C80 | 1.24315432e−26 |
| C82 | 7.03173348e−27 |
| C84 | 6.7026547e−27 |
| C86 | 3.86679665e−27 |
| C88 | 2.29279073e−28 |
| C90 | −3.42313922e−28 |

Table 3a for FIGS. 9/10

| Surface | DCX | DCY | DCZ |
|---|---|---|---|
| R1 | 0.00000000 | −2546.30347262 | 1272.00096574 |
| EP | 0.00000000 | −3748.20994321 | −67.93218033 |

Table 3b for FIGS. 9/10

| Surface | TLA[deg] | TLB[deg] | TLC[deg] |
|---|---|---|---|
| R1 | 66.10821601 | 180.00000000 | −0.00000000 |
| EP | 123.10821601 | 0.00000000 | −0.00000000 |

Table 4 for FIGS. 9/10

| Surface | AOI[deg] | Reflectivity |
|---|---|---|
| R1 | 72.00000000 | 0.74756124 |
| Overall transmission | | 0.0448 |

Table 6 for FIGS. 9/10

| X[mm] | Y[mm] | Z[mm] |
|---|---|---|
| −0.00000000 | 111.94107511 | 0.00000000 |
| 30.21941758 | 111.53491310 | 0.00000000 |
| 59.72125099 | 110.23387230 | 0.00000000 |
| 87.78528523 | 107.82806117 | 0.00000000 |
| 113.69960356 | 104.06837684 | 0.00000000 |
| 136.79291898 | 98.75175594 | 0.00000000 |
| 156.48520093 | 91.75986373 | 0.00000000 |
| 172.33997060 | 83.02742979 | 0.00000000 |
| 184.09205811 | 72.42866209 | 0.00000000 |
| 191.62365228 | 59.62993643 | 0.00000000 |
| 194.87560438 | 44.11643905 | 0.00000000 |
| 193.73211589 | 25.64021335 | 0.00000000 |
| 187.99793841 | 4.84811452 | 0.00000000 |
| 177.56309924 | −16.83156478 | 0.00000000 |
| 162.58690131 | −38.28747907 | 0.00000000 |
| 143.38995723 | −59.08801236 | 0.00000000 |
| 120.25473448 | −78.30108806 | 0.00000000 |
| 93.59131919 | −94.40029272 | 0.00000000 |
| 64.09356099 | −106.55372702 | 0.00000000 |
| 32.58315266 | −114.27730772 | 0.00000000 |
| −0.00000000 | −116.93391821 | 0.00000000 |
| −32.58315266 | −114.27730772 | 0.00000000 |
| −64.09356099 | −106.55372702 | 0.00000000 |
| −93.59131919 | −94.40029272 | 0.00000000 |
| −120.25473448 | −78.30108806 | 0.00000000 |
| −143.38995723 | −59.08801236 | 0.00000000 |
| −162.58690131 | −38.28747907 | 0.00000000 |
| −177.56309924 | −16.83156478 | 0.00000000 |
| −187.99793841 | 4.84811452 | 0.00000000 |
| −193.73211589 | 25.64021335 | 0.00000000 |
| −194.87560438 | 44.11643905 | 0.00000000 |
| −191.62365228 | 59.62993643 | 0.00000000 |
| −184.09205811 | 72.42866209 | 0.00000000 |
| −172.33997060 | 83.02742979 | 0.00000000 |
| −156.48520093 | 91.75986373 | 0.00000000 |
| −136.79291898 | 98.75175594 | 0.00000000 |
| −113.69960356 | 104.06837684 | 0.00000000 |
| −87.78528523 | 107.82806117 | 0.00000000 |
| −59.72125099 | 110.23387230 | 0.00000000 |
| −30.21941758 | 111.53491310 | 0.00000000 |

An overall reflectivity of the optical subsystem 36 is 4.48%.

The mirror 23 (R1) has negative values for the radius, i.e. it is, in principle, a concave mirror. The value $R_y$ is very large in absolute terms for the mirror 23, and so the mirror only deviates slightly from a planar reflection surface in the associated plane.

The arrangement plane 17 is perpendicular to the yz-plane and tilted in relation to the xz-plane by an angle α of approximately 24°. This corresponds to the TLA value of the "EP" surface in Table 3b for FIGS. 9 and 10 of 66.108°, which was measured proceeding from the xy-plane.

On the basis of FIGS. 11 and 12, two different coupling-in variants by way of the last GI mirror 23 (R1) for coupling the illumination light 3 into the object field 4 with folding in the yz-plane are considered in more detail.

Components and functions corresponding to those which were already explained above with respect to FIGS. 1 to 10 have the same reference signs and are not once again discussed in detail.

FIG. 11 shows a section on the beam path of an optical subsystem 38 between the arrangement plane 17 and the deflection at the mirror M2 of the projection optical unit 7.

In respect of coupling-in the illumination light 3 into the object field 4 by way of the GI mirror 23, the optical subsystem 38 is similar to the optical subsystem 25 according to FIGS. 3 and 4. In contrast thereto, an imaging optical subunit 39 of the optical subsystem 38 has exactly one GI mirror, namely the GI mirror 23 (R1). In this respect, the imaging optical subunit 39 corresponds to the imaging optical subunit 37 according to FIGS. 9 and 10.

In the optical subsystem 38, the crossing conditions of the illumination or imaging light 3 correspond to those in the optical subsystem 25 in the region of coupling the illumination or imaging light 3 into the object field 4. In the optical subsystem 38, folding is also only carried out in the yz-plane.

The illumination-side imaging light partial beam 27, which extends toward the GI mirror 23 (R1), also crosses the imaging-side imaging light partial beam 28 in a crossing region 29 in the coupling-in variant according to FIG. 12. In the coupling-in variant according to FIG. 12, the last GI mirror 23 (R1) lies between the imaging-side imaging light partial beam 28 and the mirror M2, i.e., in relation to this imaging-side imaging light partial beam 28, it lies precisely opposite the arrangement of the last GI mirror 23 (R1) in the coupling-in variant according to FIG. 11. In the optical subsystem 40 according to FIG. 12 with the imaging optical subunit 41, which in turn has exactly one GI mirror 23, there is a corresponding displacement of the arrangement plane 17, which can take into account corresponding desired installation space properties for a pupil facet mirror of the illumination optical unit 6 of the projection exposure unit 1. Moreover, respectively different installation space possibilities emerge in the vicinity of the object field 4.

As an alternative or in addition to folding the illumination light 3 in the imaging optical subunit in the yz-plane, as explained above in conjunction with the embodiments according to FIGS. 2 to 12, there can also be folding in the xz-plane, as will be subsequently explained on the basis of FIGS. 13 to 16.

Components and functions corresponding to those which were already explained above with respect to FIGS. 1 to 12 have the same reference signs and are not once again discussed in detail.

Figure 13:
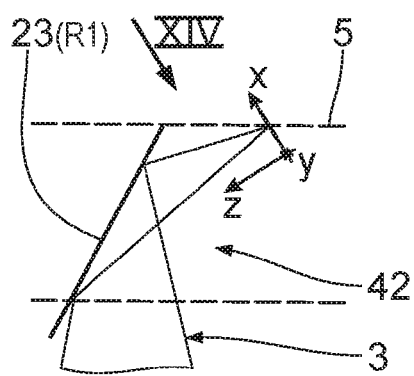
FIG. 13 schematically shows a folding effect of the mirror for grazing incidence of the imaging optical subunit, which constitutes the last mirror in the beam path upstream of the object field, wherein a folding plane of this mirror is perpendicular to the object displacement direction of the object to be imaged by the imaging optical unit.
Figure 14:
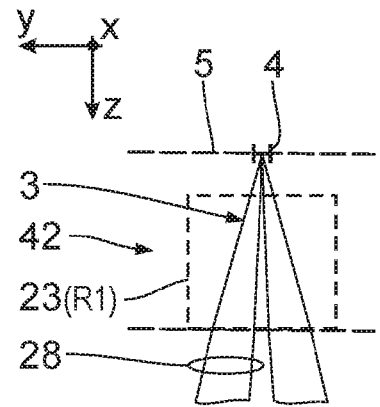
FIG. 14 shows the beam path in the region of the mirror for grazing incidence according to FIG. 13, as seen from the viewing direction XIV in FIG. 13.

FIGS. 13 and 14 show such alternative coupling-in via the last GI mirror 23 (R1) of an imaging optical subunit 42 with the folding plane in the xz-plane.

FIG. 14 shows a view corresponding to that of e.g. FIGS. 11 and 12, i.e. with a viewing direction on the yz-plane, in which the object displacement also takes place. FIG. 13 shows a view of the xz-plane perpendicular thereto. The illumination light 3 is therefore coupled-in with the imaging optical subunit 42 with a folding effect in the xz-plane. The GI mirror 23 can simultaneously be used to fold the imaging light 3, once again in the xz-plane, which light extends from the object field 4 in the imaging light partial beam 28 to the first mirror of the projection optical unit. This is indicated in FIG. 14, where the GI mirror 23 also reflects this imaging-side imaging light partial beam 28.

Figure 15:
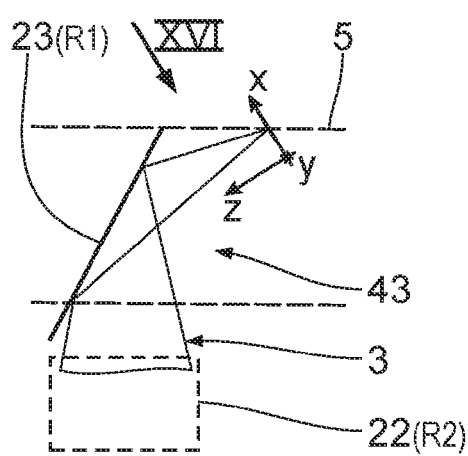
FIGS. 15 and 16 show, in an illustration similar to FIGS. 13 and 14, a folding effect of two mirrors for grazing incidence of a further variant of an imaging optical subunit of the optical subsystem, wherein the folding plane of the last mirror of the imaging optical subunit in the beam path upstream of the object field is arranged perpendicular to the object displacement direction and the folding plane of the penultimate mirror in the beam path upstream of the object field contains the object displacement direction, i.e. is arranged perpendicular to the folding plane of the last mirror in the beam path upstream of the object field.
Figure 16:
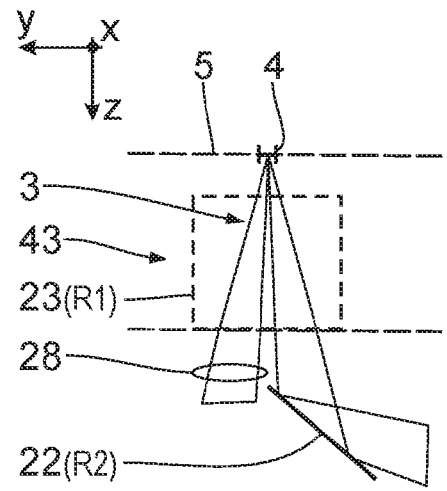

A combination of an xz-fold according to FIGS. 13 and 14 with an additional yz-fold is explained on the basis of FIGS. 15 and 16. FIG. 16 shows the embodiment from the viewing direction XVI in FIG. 15. Components and functions corresponding to those which were explained above with respect to FIGS. 1 to 14 have the same reference signs and are not once again discussed in detail.

In addition to the last GI mirror 23 (R1) upstream of the object field 4, which GI mirror folds in the xz-plane, an imaging optical subunit 43 according to FIGS. 15 and 16 has a further GI mirror 22 (R2), which folds in the yz-plane. The illumination light 3 is therefore initially folded in the yz-plane by the GI mirror 22 (R2) and subsequently folded in the xz-plane by the further GI mirror 23 (R1), before it impinges on the object field 4.

Depending on the folding effects of the GI mirror 23 (R1) or GI mirrors 22 (R2) and 23 (R1) in the embodiments according to FIGS. 13 to 16, different spatial positions of the arrangement plane 17 for the pupil facet mirror of the illumination optical unit 6 emerge in each case, which can in turn take account of corresponding desired installation space properties of the illumination optical unit 6.

Below, a further embodiment of a microlithographic projection exposure apparatus 1, depicted very schematically and in the meridional section, is described on the basis of FIG. 17. Components and functions corresponding to those which were already explained above with respect to FIGS. 1 to 16 have the same reference signs and are not once again discussed in detail. The light source 2 of this projection exposure apparatus 1 according to FIG. 17 can correspond to the one which is already explained above. It can be an LPP (laser produced plasma) light source or a DPP (discharge produced plasma) light source. Alternatively, and assuming a corresponding adaptation to a numerical aperture in an intermediate focus, the light source 2 can also be a synchrotron radiation-based light source, for example a free electron laser (FEL).

In order to simplify the illustration of positional relationships, use is likewise made below of a Cartesian xyz-coordinate system. The x-direction extends perpendicular to the plane of the drawing in FIG. 17 and into the latter. In FIG. 17, the y-direction extends to the right. In FIG. 17, the z-direction extends downward. The coordinate systems used following FIG. 17 respectively have x-axes extending parallel to one another. To the extent that merely one component of the projection exposure apparatus 1 is depicted, the profile of a z-axis of these coordinate systems follows a respective main direction of illumination light 3 within the respectively considered figure.

Figure 17:
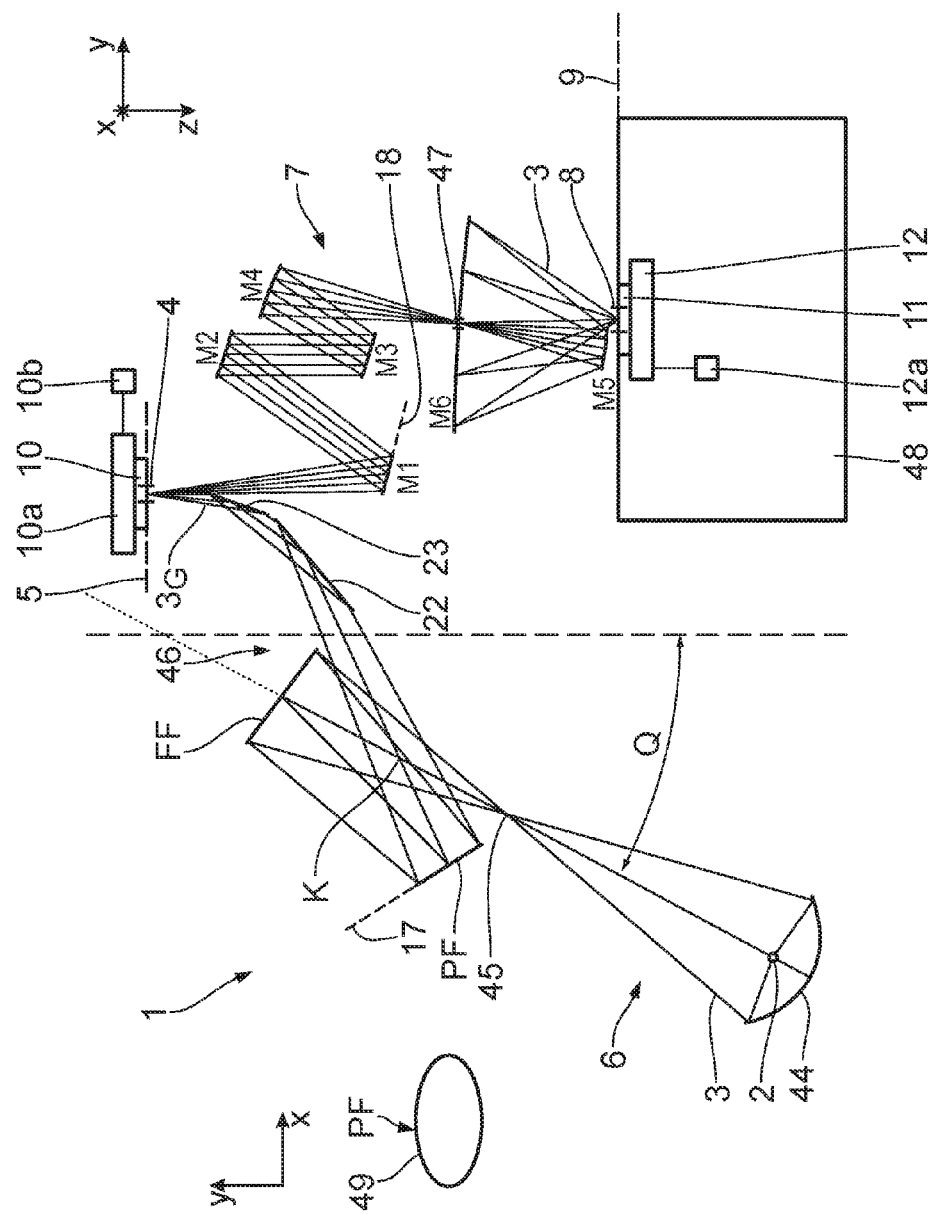
FIG. 17 shows very schematically, in a meridional section, a further embodiment of a projection exposure apparatus for EUV projection lithography, including a light source, an illumination optical unit and a projection optical unit.

Proceeding from the light source 2, initially a collector 44 and a field facet mirror FF serve to guide the illumination light 3 in the projection exposure apparatus according to FIG. 17. An intermediate focus 45 of the illumination light 3 is arranged between the collector 44 and the field facet mirror FF. By way of example, a numerical aperture of the illumination light 3 in the region of the intermediate focus 45 is NA=0.2. The field facet mirror FF is part of an illumination optical unit 6 of the projection exposure apparatus 1, which serves to illuminate an object field 4 arranged in an object plane 5.

The field facet mirror FF is arranged in a field plane of the illumination optical unit 6 conjugate to the object plane 5. A pupil facet mirror PF of the illumination optical unit 6 is arranged downstream of the field facet mirror FF. The pupil facet mirror PF is arranged in, or in the region of, a pupil plane 17 of the illumination optical unit 6. An illumination pupil of the illumination optical unit 6 lies in the pupil plane 17.

Arranged downstream of the pupil facet mirror PF in the beam path of the illumination light 3 are two mirrors 22, 23 for grazing incidence arranged in succession in the beam path, which are also denoted GI (grazing incidence) mirrors below.

An angle of incidence of the centroid beam of the illumination light overall beam $3_G$ on both GI mirrors 22, 23 is approximately 75°. A different angle of incidence in the region of between 60° and 85° is also possible.

The two GI mirrors 22, 23 are arranged in such a way that the deflection effects thereof on the illumination light 3 add up.

A beam path of a centroid ray of the illumination light 3 has a crossing point K in the illumination optical unit 6. At the crossing point K, the centroid ray of the illumination light 3 extending between the intermediate focus 45 and the field facet mirror FF crosses the centroid ray extending between the pupil facet mirror PF and the first GI mirror 22.

The field facet mirror FF is constructed from a plurality of field facets. Each one of these field facets is in turn constructed from at least one individual mirror. Details in this respect are described in e.g. US 2011/0001947 A1. Then, a field facet is formed in each case by a plurality or a group of such individual mirrors in the case of such an individual mirror construction. An x/y-aspect ratio of the field facets can be greater than the aspect ratio xo/yo of the object field 4.

The facets of the field facet mirror FF can be embodied in a manner switchable between a plurality of tilt positions. This renders it possible to prescribe different illumination angle distributions in the object field 4, as is already known per se from the prior art of illumination optical units with a field facet mirror and a pupil facet mirror.

The pupil facet mirror PF in turn has a plurality of pupil facets. Each one of these pupil facets can in turn be constructed from a plurality of individual mirrors, as is likewise known per se from US 2011/0001947 A1. The facet design of the facet mirrors FF, PF is not depicted in any more detail in the drawing.

The facets of the pupil facet mirror PF can be configured in a switchable manner. Alternatively, it is possible to configure the facets of the pupil facet mirror PF in a non-switchable manner.

The pupil facet mirror PF and the two downstream GI mirrors 22, 23 form a transmission optical unit 46, which images the field facets of the field facet mirror FF superposed on one another in the object field 4 by way of illumination channels, which each have assigned to them a field facet and a pupil facet.

The two GI mirrors 22, 23 image the illumination pupil in the pupil plane 17 into an entry pupil plane 18, disposed downstream of the object field 4 in the beam path of the illumination light 3, of a projection optical unit 7 of a projection exposure apparatus 1. The projection optical unit 7 images the object field 4 into an image field 8 which is arranged in an image plane 9. The entry pupil of the projection optical unit 7 does not in reality lie in the same entry pupil plane for both sections xz, yz. In the yz-section, the entry pupil actually lies at the location of the pupil facet mirror PF, and so, in this section, there is coincidence of, firstly, the illumination pupil and, secondly, the entry pupil. In the xz-section, the entry pupil of the projection optical unit 7 lies significantly downstream of the object field 4 in the beam path.

Arranged in the object field 4 is a reflecting reticle 10, which carries a structure imageable via the projection optical unit 7.

The two GI mirrors 22, 23 produce an illumination angle bandwidth of an illumination light overall beam $3_G$ composed of the illumination channels in the object field 4, which bandwidth is smaller for a plane of incidence parallel to the object displacement direction or scanning direction y than for a plane of incidence perpendicular thereto.

A numerical aperture of the illumination light overall beam $3_G$ incident on the object field 8 is e.g. 0.0625 in the yz-plane of incidence. Accordingly, an angle of incidence of a central centroid beam of the illumination light overall beam $3_G$ on the reticle 10 is greater than 3.6° in the yz-plane of incidence and can for example lie in the range between 4° and 7°.

In the xz-plane perpendicular to the yz-plane of incidence, the numerical aperture of the illumination light overall beam $3_G$ is at least 10% greater than in the yz-plane of incidence and it is, for example, twice as large. The numerical aperture of the illumination light overall beam $3_G$ is e.g. 0.125 in the xz-plane.

Using the illumination optical unit 6, the object field 4 on the reticle 10 is illuminated in a defined manner in the object plane 5. The object field 4 has an arcuate or partial-circle-shaped form and is delimited by two mutually parallel circular arcs and two straight side edges, which extend in the y-direction with a length yo and have a distance xo from one another in the x-direction. The aspect ratio $x_0/y_0$ is 13 to 1. In the case of an alternative and likewise possible object field 4, the edge shape thereof is rectangular.

The projection optical unit 7 has a total of six mirrors M1 to M6 arranged in succession in the beam path of the illumination or imaging light 3. The last mirror M6 defining an image-side numerical aperture of the projection optical unit 7 is the only one of these mirrors M1 to M6 which has a passage opening 47 for the illumination or imaging light 3.

All optical components of the illumination optical unit 6 on the one hand and of the projection optical unit 7 on the other hand have highly reflective coatings for the illumination or imaging light 3, which coatings can be constructed as multi-ply or many-ply layers.

A wafer 11, on which the structure of the reticle 10 arranged in the object field 4 is imaged, is arranged in the image field 8. Like the reticle 10, the wafer 11 is also carried by a holder 10a, 12.

Both the reticle holder 10a and the wafer holder 12 are displaceable in both the x-direction and the y-direction by way of corresponding displacement drives 10b, 12a. During the projection exposure, this displacement is brought about in a synchronized manner along the y-direction, which is also referred to as scanning direction. The scanning direction y lies on the reticle 10 in a yz-plane of incidence of the illumination light 3. This yz-plane of incidence coincides with the plane of the drawing of FIG. 17.

A desired installation space property of the wafer holder 12 and of further wafer-side components is depicted as a rectangular box at 48 in FIG. 17. The desired installation space property 48 is rectangular with an extent in the x-direction, y-direction and z-direction that is dependent on the components to be housed therein. By way of example, proceeding from the centre of the image field 8 in the x-direction and in the y-direction, the desired installation space property 48 has an extent of 1 m. Proceeding from the image plane 9, the desired installation space property 48 also has an extent of e.g. 1 m in the z-direction. The illumination light 3 is guided in the illumination optical unit 6 and in the projection optical unit 7 in such a way that it is respectively guided past the desired installation space property 48.

The field facet mirror FF and/or the pupil facet mirror PF can be embodied as MEMS mirrors.

The projection optical unit 7 is embodied as an anamorphic projection lens and has a reducing imaging factor in the yz-plane, which is twice the reducing imaging factor in the xz-plane. By way of example, the reducing factor of the projection optical unit 7 in the yz-plane can be 8 and it can be 4 in the xz-plane. Such an anamorphic projection optical unit is known from e.g. WO 2012/034995 A2.

The two GI mirrors 22, 23 ensure an adaptation of the numerical apertures of the illumination light overall beam $3_G$ at the object field 4 in such a way that the numerical apertures of the illumination light overall beam $3_G$ fit to the object field-side numerical apertures which can be processed by the anamorphic projection optical unit 7.

The angle bandwidth of the illumination light overall beam $3_G$ constitutes a measure for the numerical aperture thereof. In the exemplary embodiment explained above, an x/y-aspect ratio of this angle bandwidth is 2:1 and this corresponds to the ratio of the numerical apertures explained above, i.e. the ratio of 0.125 to 0.0625.

A source angle of the projection exposure apparatus 1 is defined as an angle between a connecting line between the light source 2 and the intermediate focus 45 on the one hand and a normal to the xy-plane on the other hand. In the projection exposure apparatus 1, this source angle Q is approximately 28°.

A centroid ray of the illumination light overall beam $3_G$ is deflected by approximately 30° by the two GI mirrors 22, 23. Other centroid ray deflection angles in the range between 10° and 35° are also possible.

This deflection angle is divided approximately half and half between the two GI mirrors 22 and 23.

The crossing point K lies between an extent of the centroid ray between the facet mirrors FF and PF on the one hand and the image field 8 on the other hand in the beam path of the illumination optical unit 6 according to FIG. 17.

A totality of the pupil facets on the pupil facet mirror PF has an edge contour 49, the extent of which corresponds to the extent of the illumination pupil. Parallel to the x-direction, i.e. perpendicular to the object displacement direction, this extent is greater than perpendicular thereto, i.e. in the yz-plane of incidence containing the scanning direction. In a local xy-coordinate system, the pupil facet mirror PF thus has a greater extent in the x-direction than in the y-direction. This is shown in an insert in FIG. 17, in which an elliptic edge contour 49 of the pupil facet mirror PF is depicted. An x/y-aspect ratio of this edge contour 49 can be e.g. 4/3 and it is significantly smaller than the x/y-aspect ratio of the angle bandwidth at the object field, which was explained above. The aspect ratio x/y of the edge contour 49 is smaller than an aspect ratio sigmax/sigmay between the dimensions sigmax and sigmay of the illumination pupil, which are assigned to these extents x and y perpendicular and parallel to the object displacement direction.

In an alternative design of the illumination optical unit 6, the pupil facet mirror PF is configured with an x/y-aspect ratio of the order of 1, for example is a round pupil facet mirror PF.

The x/y-aspect ratios of the edge contour 49 of the pupil facet mirror PF explained above render it possible to keep field facet switching angles or individual mirror switching angles of the field facet mirror FF for illuminating the pupil facet mirror PF small in the case of otherwise predetermined geometry of an illumination optical unit 6.

Figure 18:
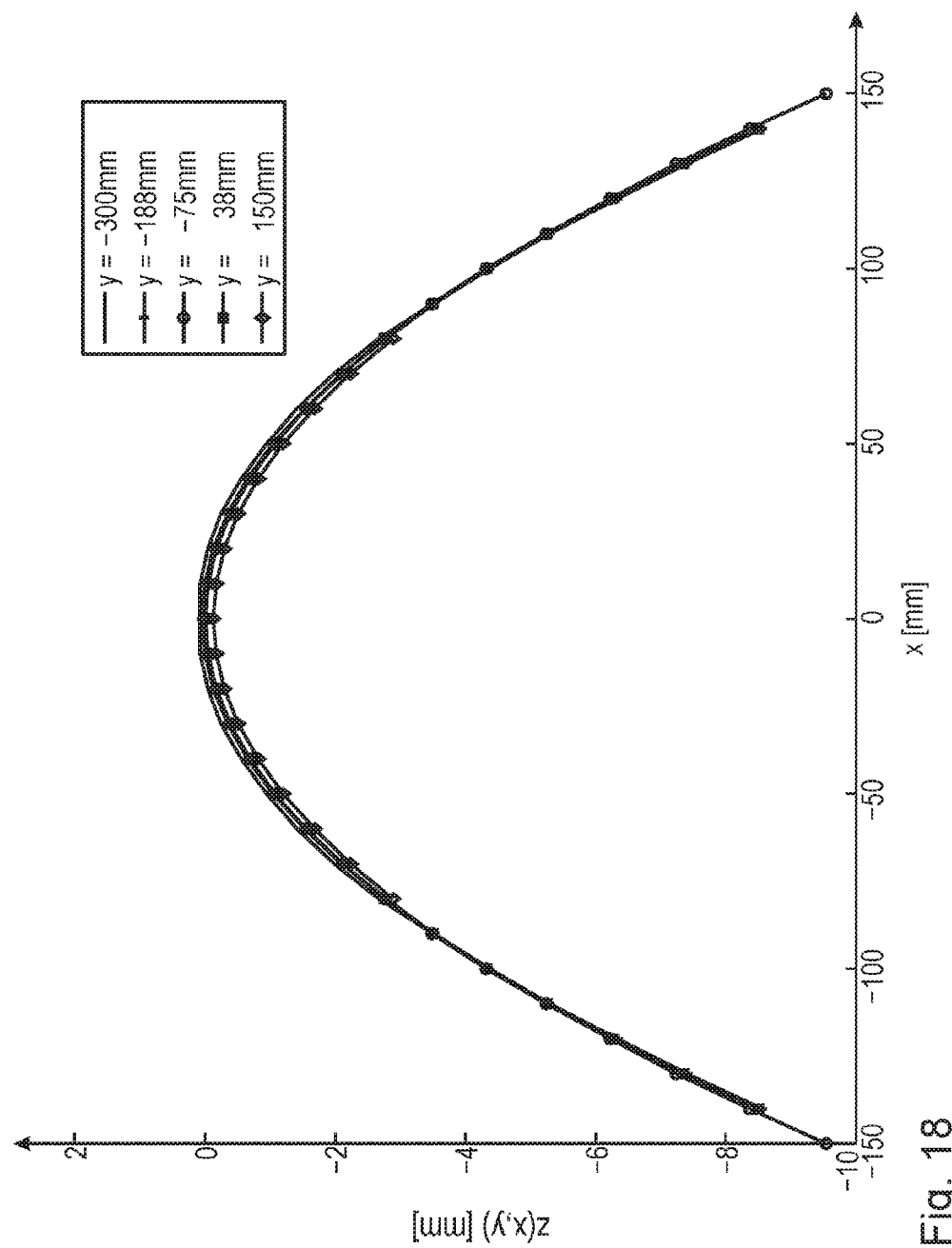
FIG. 18 shows xz-section lines, which reproduce sections through a reflection surface of a first mirror for grazing incidence of the illumination optical unit downstream of a pupil facet mirror, wherein sections are shown perpendicular to a plane of incidence in mutually spaced apart, parallel sectional planes.

In a local xz-diagram, FIG. 18 shows a number of sections through the reflection surface of the GI mirror 22, first in the beam path, of the embodiment according to FIG. 17. A form of this xz-section line is dependent on the respective y-coordinate, along which the section is guided.

Figure 19:
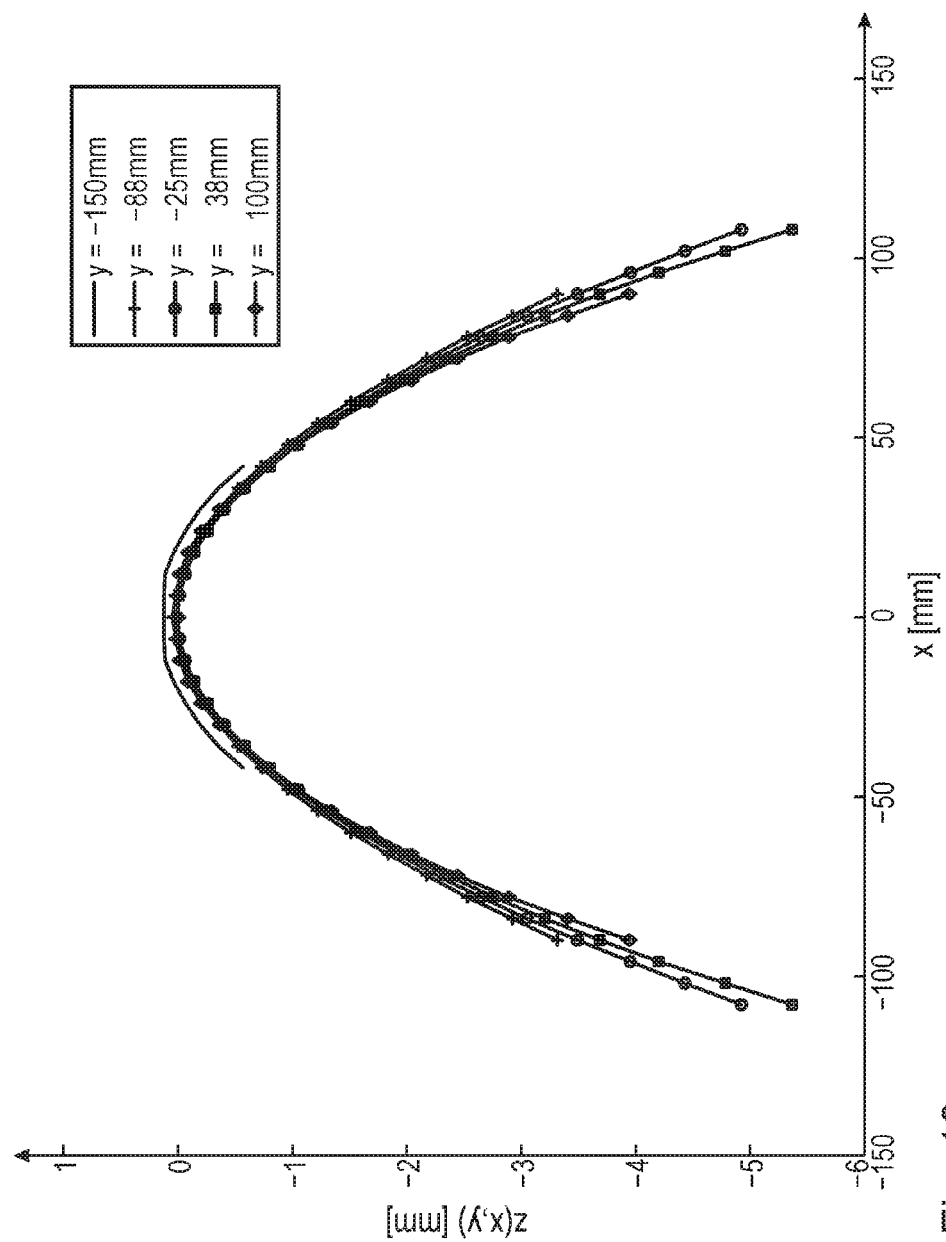
FIG. 19 shows, in a sectional line illustration similar to FIG. 18, corresponding sections through a reflection surface of a second mirror for grazing incidence, which is arranged between the first mirror for grazing incidence and an object field illuminated by way of the illumination optical unit.

FIG. 19 shows corresponding xz-section lines in the case of different y-coordinates through the reflection surface of the subsequent, second GI mirror 23 in the embodiment according to FIG. 17.

The reflection surfaces of the two GI mirrors 22 and 23 according to FIGS. 17 to 19 can be described via a generalized conical section asphere equation. Here, the following applies:

$$z(x,y)=f1(x,y)+f2(x,y) \tag{1}$$

z is the sag of the reflection surface in the z-direction of the local yz-coordinate system of the respective GI mirror 22, 23. The following applies to both terms f1 and f2:

$$f1 = (rhox*x**2 + rhoy*y**2)/$$
$$(1 + [1-(1+kx)*(rhox*x)**2-(1+ky)*(rhoy*y)2]0.5)$$
$$f2 = c1*x + c2*y + c3*x**2 + c4*x*y + c5*y**2 + c6*x**3 +$$
$$\ldots + c9*y**3 + c10*x**4 + \ldots + c12*x**2*y**2 +$$
$$\ldots + c14*y**4 + c15*x**5 + \ldots + c20*y**5 +$$
$$c21*x**6 + \ldots + c24*x**3*y**3 + \ldots + c27*y**6 + \ldots$$

Here, f1 corresponds to a conical section and f2 is a polynomial expansion generalizing the latter.

Here, the variables rhox and rhoy are inverses of the vertex radii vertex radius(x) and vertex radius(y), the variables kx and ky correspond to the conical constants kappa(x) and kappa(y). For reasons of symmetry, all odd polynomials in relation to x disappear.

The following two tables summarize the design parameters, which are to be used to describe the surface of the reflection surfaces of the two GI mirrors 22 and 23 in the generalized conical section asphere equation 1 above.

TABLE 1

Surface data for GI mirror 22

Asphere Surface: GI mirror 22
Asphere type: KXY
Constants:

vertex radius(x) = −1161.133897
vertex radius(y) = 78026.475497
kappa(x) = 11.345415350
kappa(y) = 12492.823560000
Series expansion constants:

c1 = 0.00000000E+00
c2 = 0.00000000E+00
c3 = 5.54608544E−06

TABLE 1-continued

Surface data for GI mirror 22

| | |
|---|---|
| c4 | = 0.00000000E+00 |
| c5 | = −7.87263073E−06 |
| c6 | = 0.00000000E+00 |
| c7 | = −1.73373485E−08 |
| c8 | = 0.00000000E+00 |
| c9 | = −1.55353421E−08 |
| c10 | = 2.08902055E−10 |
| c11 | = 0.00000000E+00 |
| c12 | = −5.03741523E− |
| c13 | = 0.00000000E+00 |
| c14 | = −2.16016795E−11 |
| c15 | = 0.00000000E+00 |
| c16 | = 4.46517037E−13 |
| c17 | = 0.00000000E+00 |
| c18 | = 1.45192600E−12 |
| c19 | = 0.00000000E+00 |
| c20 | = −2.53950200E−13 |
| c21 | = 3.28893261E−14 |
| c22 | = 0.00000000E+00 |
| c23 | = −3.17999488E−15 |
| c24 | = 0.00000000E+00 |
| c25 | = 6.46841816E−15 |
| c26 | = 0.00000000E+00 |
| c27 | = −8.60352971E−16 |
| c28 | = 0.00000000E+00 |
| c29 | = −2.17603010E−16 |
| c30 | = 0.00000000E+00 |
| c31 | = 1.01297045E−16 |
| c32 | = 0.00000000E+00 |
| c33 | = −1.02694152E−17 |
| c34 | = 0.00000000E+00 |
| c35 | = 0.00000000E+00 |

TABLE 2

Surface data GI mirror 23

Asphere Surface: GI mirror 23
Asphere type: KXY
Constants:

vertex radius(x) = −1118.269321
vertex radius(y) = −166716.903905
kappa(x) = −39.211036180
kappa(y) = 0.243886680E+06
Series expansion constants:

| | |
|---|---|
| c1 | = 0.00000000E+00 |
| c2 | = 0.00000000E+00 |
| c3 | = −7.94941515E−06 |
| c4 | =0.00000000E+00 |
| c5 | = 8.64136545E−06 |
| c6 | = 0.00000000E+00 |
| c7 | = −1.96099022E−07 |
| c8 | = 0.00000000E+00 |
| c9 | = −2.83276609E−09 |
| c10 | = −5.06097808E−10 |
| c11 | = 0.00000000E+00 |
| c12 | = 1.17710881E−10 |
| c13 | = 0.00000000E+00 |
| c14 | = 8.11300340E−11 |
| c15 | = 0.00000000E+00 |
| c16 | = 2.44564710E−12 |
| c17 | = 0.00000000E+00 |
| c18 | = −4.18622465E−13 |
| c19 | = 0.00000000E+00 |
| c20 | = 9.23896853E−13 |
| c21 | = −6.94696602E−14 |
| c22 | = 0.00000000E+00 |
| c23 | = −7.11518761E−14 |
| c24 | = 0.00000000E+00 |
| c25 | = −5.76295970E−15 |
| c26 | = 0.00000000E+00 |
| c27 | = 6.09159387E−15 |
| c28 | = 0.00000000E+00 |

TABLE 2-continued

Surface data GI mirror 23

| | |
|---|---|
| c29 | = −3.19720083E−15 |
| c30 | = 0.00000000E+00 |
| c31 | = 3.74811351E−16 |
| c32 | = 0.00000000E+00 |
| c33 | = −5.13048163E−16 |
| c34 | = 0.00000000E+00 |
| c35 | = 0.00000000E+00 |

On the basis of FIGS. 20 to 23, further design options for illumination optical units with respectively two GI mirrors between the pupil facet mirror PF and the object field 4 are explained below, which options can be used instead of the illumination optical unit 6 according to FIG. 17 in the projection exposure apparatus 1. Components corresponding to those which were already explained above with respect to FIGS. 1 to 19 and, in particular, with respect to FIGS. 17 to 19 have the same reference signs and are not once again discussed in detail.

Figure 20:
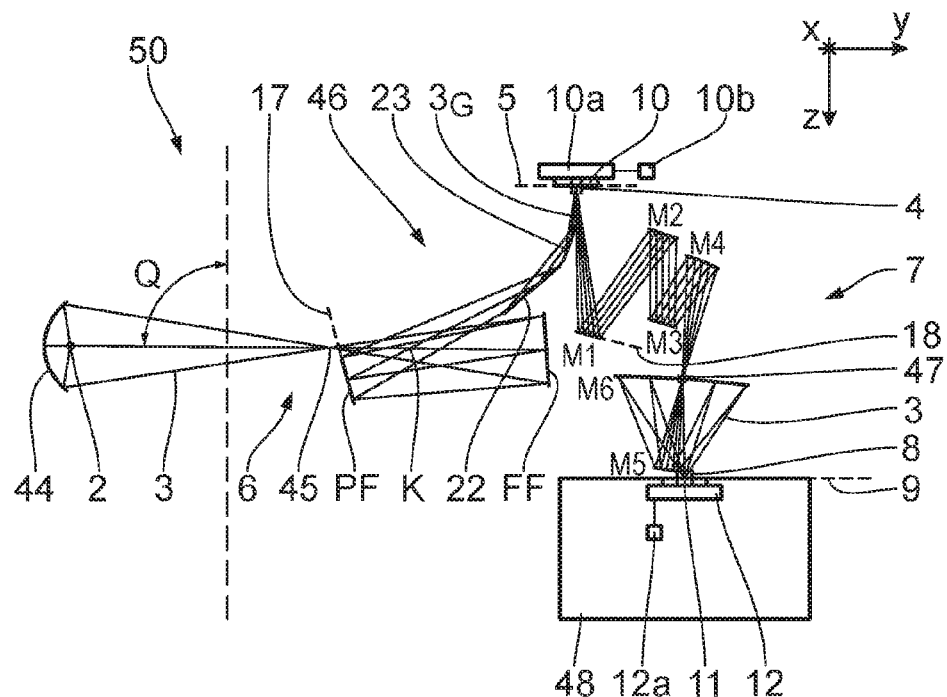
FIGS. 20 to 23 show, in illustrations similar to FIG. 17, further embodiments of an illumination optical unit within the projection exposure apparatus.

FIG. 20 shows a further embodiment of an illumination optical unit 50. The illumination optical unit 50 has a source angle Q of 90°. Thus, the illumination light 3 is guided horizontally to the intermediate focus 45 from the light source 2.

In the illumination optical unit 50, a folding geometry for the illumination light 3 by way of the two facet mirrors FF and PF is such that an extent of the centroid ray between the facet mirrors FF and PF lies between the crossing point K and the image field 8.

Figure 21:
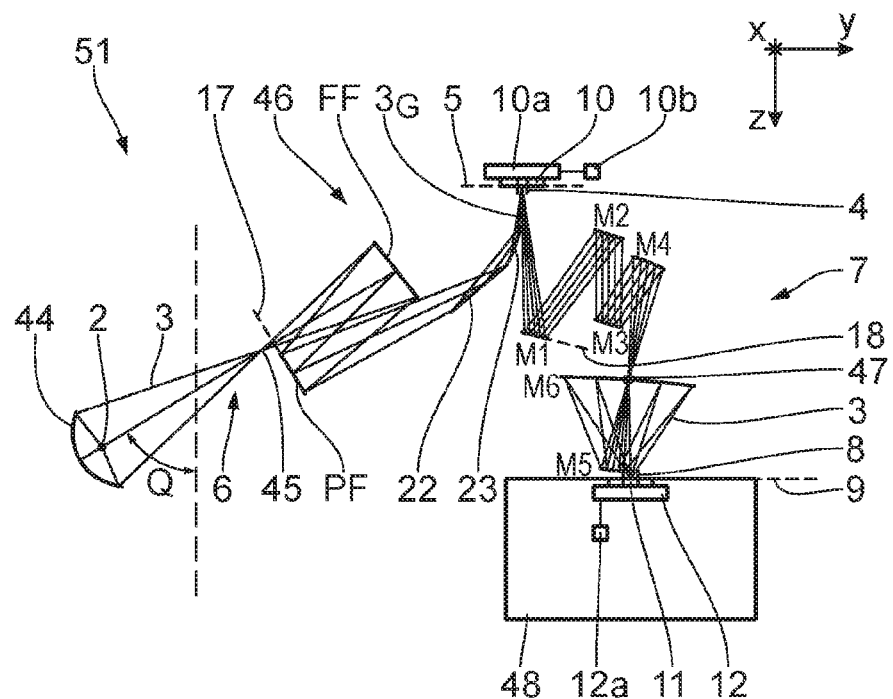

FIG. 21 shows an embodiment of an illumination optical unit 51, in which there is no crossing of an extent of the centroid ray of the illumination light between the intermediate focus 45 and the object field 4. In the illumination optical unit 51, a source angle Q is approximately 59°. The extent of the centroid ray of the illumination light 3 between the pupil facet mirror PF and the first GI mirror 22 lies between the field facet mirror FF and the image field 8.

Figure 22:
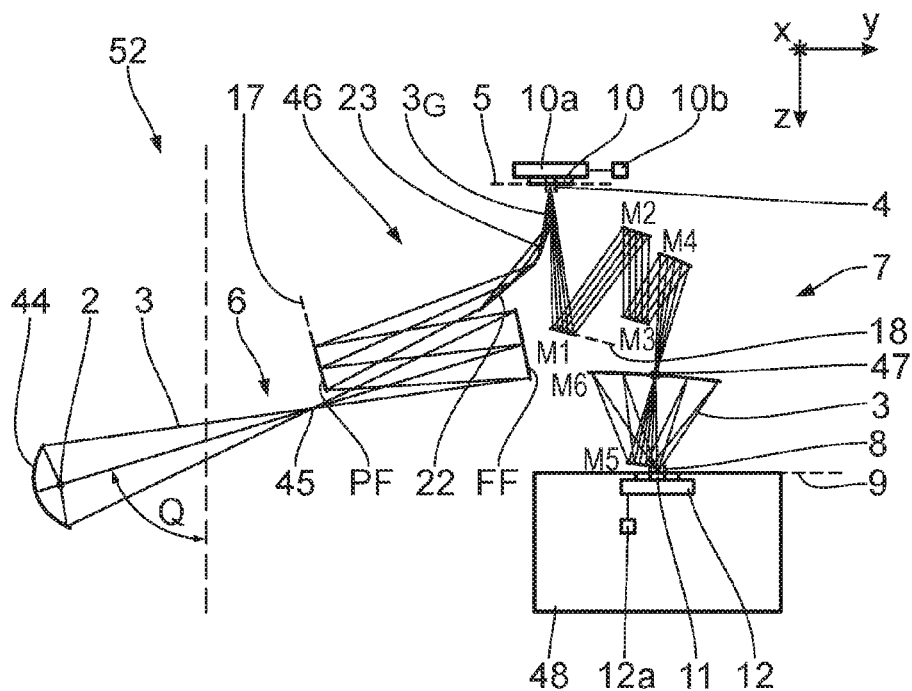

FIG. 22 shows an embodiment of the illumination optical unit 52, in which the field facet mirror FF lies between an extent of the centroid ray of the illumination light 3 between the pupil facet mirror PF and the first GI mirror 22 on the one hand and the image field 8 on the other hand. In the illumination optical unit, a source angle Q is approximately 73°. In this case too, there is no crossing of the illumination light centroid ray between the intermediate focus 45 and the object field 4.

Figure 23:
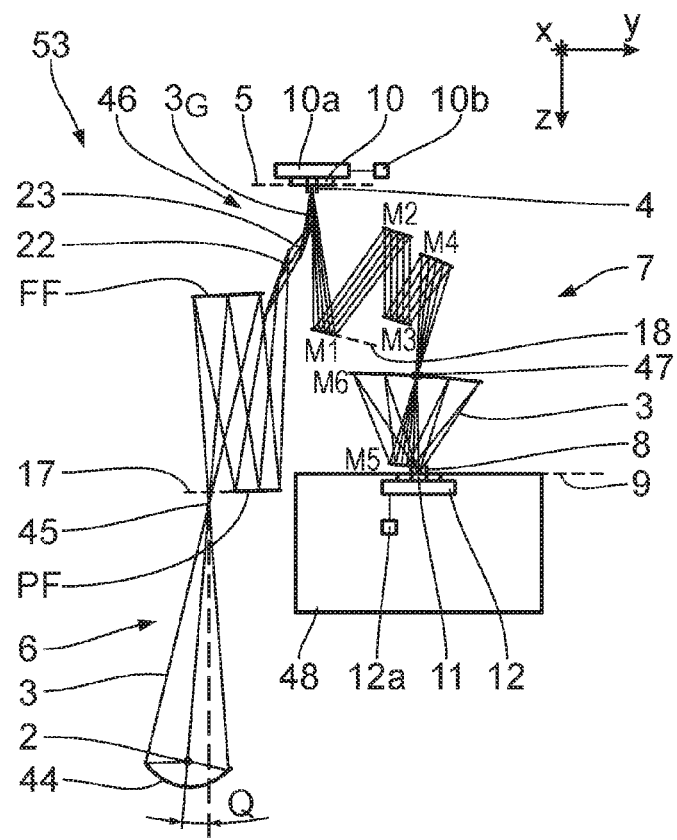

FIG. 23 shows an embodiment of an illumination optical unit 53, in which the deflection effect of the two GI mirrors 22, 23 on the illumination light does not add, as is the case in the illumination optical units described above, but rather subtracts. The two GI mirrors 22, 23 thus have an opposite deflection effect on a centroid ray of the illumination light overall beam $3_G$ in the illumination optical unit 53. Otherwise, an extent of the illumination light 3 between the light source 2 and the first GI mirror 22 is comparable to the extent in the illumination optical unit 51 according to FIG. 21. On account of the deflecting effect of the GI mirror 22 of the illumination optical unit 53, which is the inverse of the deflecting effect of the GI mirror 22 of the illumination optical unit 51, there is a corresponding tilt of all optical components of the projection exposure apparatus 1 upstream of the GI mirror 22, leading to a source angle Q of approximately 5°.

The optical effect of the two GI mirrors 22, 23 can lead to a dependence of a field imaging scale on a pupil coordinate sigmax, sigmay assigned to the spatial coordinates x and y, respectively. An imaging scale $\beta_y$, i.e. an imaging scale in the yz-plane, can vary by several 10% about a mean scale value. The imaging scale $\beta_x$ in the direction perpendicular thereto can also vary. This can be compensated by appropriately adapted x/y-aspect ratios of the field facets of the field facet mirror FF, respectively imaged by way of the pupil facets. To this end, it is advantageous if the field facets of the field facet mirror FF can be composed of freely selectable individual mirror groups, as, in principle, has already been described in e.g. US 2011/0318696 A1.

A reduced quality of imaging the pupil plane 17, i.e. the arrangement plane of the pupil facet mirror PF, onto the entry pupil plane 18 of the projection optical unit 7 can also involve the field facet mirror FF having field facets that are configured in a manner freely selectable from individual mirror groups. This avoids an unwanted overexposure of the entry pupil of the projection optical unit 7, for example by virtue of certain pupil facets being impinged with the illumination light 3 from field facets not illuminating the whole object field 4.

The above-described GI mirrors have a highly reflective coating for the illumination light or imaging light 3.

In order to produce a microstructured or nanostructured component, the projection exposure apparatus 1 is used as follows: First, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. An illumination optical unit configured to illuminate an object field with illumination light, the illumination optical unit comprises:
    a field facet mirror comprising a plurality of field facets, which are respectively constructed from at least one individual mirror; and
    a pupil facet mirror comprising a plurality of pupil facets, wherein:
        the illumination optical unit is configured so that, during use of the illumination optical unit in a projection exposure, an object in the object field is displaced in an object displacement direction;
        the pupil facet mirror is part of a transmission optical unit configured to image, via illumination channels, the field facets in a manner superposed on one another into the object field;
        each illumination channel is assigned to one of the field facets and one of the pupil facets;
        the transmission optical unit further comprises at least two mirrors for grazing incidence;
        the at least two mirrors are arranged downstream of the pupil facet mirror in a beam path of the illumination light to the object field;
        the at least two mirrors are configured to generate an illumination angle bandwidth of an illumination light overall beam in the object field;
        the illumination light overall beam is composed of the illumination channels;
        the bandwidth of the illumination light overall beam is smaller for a plane of incidence of the illumination light on the object field parallel to the object displacement direction than for a plane perpendicular thereto.

2. The illumination optical unit of claim 1, wherein the at least two mirrors for grazing incidence are configured so that a deflection effect thereof on the illumination light adds up.

3. The illumination optical unit of claim 1, wherein:
    a totality of the pupil facets on the pupil facet mirror has an edge contour;
    the edge contour has aspect ratio between: a) an extent of the edge contour perpendicular to the object displacement direction; and b) an extent of the edge contour parallel to the object displacement direction; and
    the aspect ratio of the edge contour is less than an aspect ratio between dimensions of an illumination pupil of the illumination optical unit which are assigned to these extents of the edge contour perpendicular and parallel to the object displacement direction.

4. The illumination optical unit of claim 1, wherein the field facets are constructed from a plurality of micro-mirrors.

5. The illumination optical unit of claim 1, wherein the field facets have an aspect ratio greater than the aspect ratio of the object field.

6. The illumination optical unit of claim 1, further comprising an imaging optical subunit configured to image an arrangement plane upstream of the object field in the beam path of the imaging light into a pupil plane of a projection optical unit arrangeable down-stream thereof, wherein the imaging optical subunit is configured so that it causes only grazing deflection of the imaging light in the beam path upstream of the object field, and imaging optical unit comprises a grazing incidence mirror as its last mirror in the beam path upstream of the object field.

7. An illumination system, comprising
    an illumination optical unit according to claim 1; and
    a projection optical unit configured to image the object field into an image field.

8. The illumination system of claim 7, wherein the projection optical unit is an anamorphic projection optical unit.

9. The illumination system of claim 7, further comprising an EUV light source.

10. A projection exposure apparatus, comprising:
    an illumination optical unit according to claim 1;
    a projection optical unit configured to image the object field into an image field;
    an object holder configured to hold the object;
    an object displacement drive configured to displace the object in the displacement direction;
    a wafer holder configured to hold a wafer; and
    a wafer displacement drive configured to displace the, wherein:
        the object holder is connected to the object displacement drive;
        the wafer holder is connected to the wafer displacement drive; and
        the projection exposure apparatus is configured so that, during use of the projection exposure apparatus, the wafer displacement drive displaces the wafer synchronously with the object displacement drive displacing the object.

11. A method, comprising:
    using an illumination optical unit to illuminate a reticle; and
    using a projection optical unit to project at least a portion of the reticle onto a material that is sensitive to EUV light,
    wherein the illumination optical unit is an illumination optical unit according to claim 1.

12. An illumination optical unit configured to illuminate an object field with illumination light, the illumination optical unit comprises:
- a field facet mirror comprising a plurality of field facets, which are respectively constructed from at least one individual mirror; and
- a transmission optical unit, comprising:
  - a pupil facet mirror comprising a plurality of pupil facets
  - a first grazing incidence mirror downstream of the pupil facet mirror along a path of the illumination light; and
  - a second grazing incidence mirror downstream of the pupil facet mirror along the path of the illumination light, wherein:
- the illumination optical unit is configured so that, during use of the illumination optical unit in a projection exposure, an object in the object field is displaced in an object displacement direction;
- the transmission optical unit is configured to image, via illumination channels, the field facets in a manner superposed on one another into the object field;
- each illumination channel is assigned to one of the field facets and one of the pupil facets;
- an illumination light overall beam comprises the illumination channels;
- the first and second grazing incidence mirrors are configured to generate an illumination angle bandwidth of the illumination light overall beam in the object field;
- the bandwidth of the illumination light overall beam in the object field is smaller for a plane of incidence of the illumination light on the object field parallel to the object displacement direction than for a plane perpendicular thereto.

13. The illumination optical unit of claim 12, wherein the first and second grazing incidence mirrors are configured so that a deflection effect thereof on the illumination light is cumulative.

14. The illumination optical unit of claim 12, wherein:
- a totality of the pupil facets on the pupil facet mirror has an edge contour;
- the edge contour has aspect ratio between: a) an extent of the edge contour perpendicular to the object displacement direction; and b) an extent of the edge contour parallel to the object displacement direction; and
- the aspect ratio of the edge contour is less than an aspect ratio between corresponding dimensions of an illumination pupil of the illumination optical unit.

15. The illumination optical unit of claim 12, wherein the field facets are constructed from a plurality of micro-mirrors.

16. The illumination optical unit of claim 12, wherein the field facets have an aspect ratio greater than the aspect ratio of the object field.

17. An illumination system, comprising
- an illumination optical unit according to claim 12; and
- a projection optical unit configured to image the object field into an image field.

18. The illumination system of claim 17, wherein the projection optical unit is an anamorphic projection optical unit.

19. A projection exposure apparatus, comprising:
- an illumination optical unit according to claim 12;
- a projection optical unit configured to image the object field into an image field;
- an object holder configured to hold the object;
- an object displacement drive configured to displace the object in the displacement direction;
- a wafer holder configured to hold a wafer; and
- a wafer displacement drive configured to displace the, wherein:
- the object holder is connected to the object displacement drive;
- the wafer holder is connected to the wafer displacement drive; and
- the projection exposure apparatus is configured so that, during use of the projection exposure apparatus, the wafer displacement drive displaces the wafer synchronously with the object displacement drive displacing the object.

20. A method, comprising:
- using an illumination optical unit to illuminate a reticle; and
- using a projection optical unit to project at least a portion of the reticle onto a material that is sensitive to EUV light, wherein the illumination optical unit is an illumination optical unit according to claim 12.

* * * * *

UNITED STATES PATENT AND TRADEMARK OFFICE
CERTIFICATE OF CORRECTION

PATENT NO. : 9,983,484 B2  
APPLICATION NO. : 15/596628  
DATED : May 29, 2018  
INVENTOR(S) : Martin Endres, Ralf Mueller and Stig Bieling Page 1 of 1

It is certified that error appears in the above-identified patent and that said Letters Patent is hereby corrected as shown below:

On the Title Page

Column 1, under (*) Notice:, Line 3, after "0 days." delete "days.".

Column 2, under (57) Abstract, Lines 11-12, delete "bandwith" and insert -- bandwidth --.

In the Specification

Column 1, Line 7, delete "PCT/EP2015/075985, filed Oct. 16, 2015," and insert -- PCT/EP2015/072985, filed Oct. 6, 2015, --.

Column 6, Line 28, delete "wafe" and insert -- wafer --.

Signed and Sealed this  
Nineteenth Day of March, 2019

Andrei Iancu  
*Director of the United States Patent and Trademark Office*